(12) United States Patent
Gal et al.

(10) Patent No.: US 12,021,312 B2
(45) Date of Patent: Jun. 25, 2024

(54) OPTICALLY SYNCHRONIZED PHASED ARRAY

(71) Applicant: California Institute of Technology, Pasadena, CA (US)

(72) Inventors: Matan Gal, Pasadena, CA (US); Craig E. Ives, Pasadena, CA (US); Armina Khakpour, Pasadena, CA (US); Seyed Ali Hajimiri, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 418 days.

(21) Appl. No.: 17/378,483

(22) Filed: Jul. 16, 2021

(65) Prior Publication Data

US 2022/0021114 A1 Jan. 20, 2022

Related U.S. Application Data

(60) Provisional application No. 63/214,524, filed on Jun. 24, 2021, provisional application No. 63/053,438, filed on Jul. 17, 2020.

(51) Int. Cl.
| | |
|---|---|
| *H01Q 3/34* | (2006.01) |
| *H01L 31/103* | (2006.01) |
| *H01Q 1/22* | (2006.01) |
| *H03F 3/195* | (2006.01) |
| *H03L 7/08* | (2006.01) |

(52) U.S. Cl.
CPC .............. *H01Q 3/34* (2013.01); *H01L 31/103* (2013.01); *H01Q 1/2283* (2013.01); *H03F 3/195* (2013.01); *H03L 7/08* (2013.01); *H03F 2200/451* (2013.01)

(58) Field of Classification Search
CPC ...... H01Q 3/34; H01Q 1/2283; H01L 31/103; H03F 3/195; H03L 7/08
USPC ......................................................... 342/372
See application file for complete search history.

(56) References Cited

U.S. PATENT DOCUMENTS

| | | | |
|---|---|---|---|
| 6,778,843 | B2 | 8/2004 | Oura |
| 6,831,600 | B1 | 12/2004 | Cherrette et al. |
| 7,848,719 | B2 | 12/2010 | Krishnaswamy et al. |

(Continued)

FOREIGN PATENT DOCUMENTS

| | | | | |
|---|---|---|---|---|
| CN | 108988948 A | * | 12/2018 | ........... H04B 10/293 |
| CN | 116075978 A | | 5/2023 | |

(Continued)

OTHER PUBLICATIONS

Mizrahi et al., "Flexible phased array shape reconstruction", 2021 IEEE/MTT-S International Microwave Symposium (IMS), 2021, 3 pgs.

(Continued)

*Primary Examiner* — Harry K Liu
(74) *Attorney, Agent, or Firm* — KPPB LLP

(57) ABSTRACT

Disclosed herein is a phased antenna array which is configured to provide a signal through multiple antennas. The phased antenna array may include a plurality of sub-arrays. Each sub-array may include a complete and functional optically synchronized integrated circuit including an integrated photo diode. Advantageously, integrating the photo diode into the integrated circuit may reduce the size of the sub-array and decrease the length the high frequency timing signal is passed.

26 Claims, 40 Drawing Sheets

(56) References Cited

U.S. PATENT DOCUMENTS

| | | | |
|---|---|---|---|
| 9,014,568 B2* | 4/2015 | Qian | H04B 10/27 |
| | | | 398/186 |
| 9,214,739 B2 | 12/2015 | Sover et al. | |
| 9,356,704 B1* | 5/2016 | Zanoni | G02F 7/00 |
| 10,061,125 B2 | 8/2018 | Hajimiri et al. | |
| 10,944,477 B2* | 3/2021 | Fatemi | H04B 10/572 |
| 11,112,491 B2 | 9/2021 | Abediasl et al. | |
| 11,249,370 B2 | 2/2022 | Hajimiri | |
| 11,601,183 B2 | 3/2023 | Hajimiri et al. | |
| 2003/0054790 A1 | 3/2003 | Sanada et al. | |
| 2004/0087294 A1 | 5/2004 | Wang | |
| 2005/0255387 A1 | 11/2005 | Butt et al. | |
| 2006/0246911 A1 | 11/2006 | Petermann | |
| 2007/0046547 A1 | 3/2007 | Crouch | |
| 2007/0159407 A1 | 7/2007 | Bolle et al. | |
| 2008/0252546 A1 | 10/2008 | Mohamadi | |
| 2009/0274466 A1 | 11/2009 | Cox et al. | |
| 2011/0217970 A1 | 9/2011 | Ben et al. | |
| 2012/0002967 A1 | 1/2012 | Mayer et al. | |
| 2012/0039366 A1 | 2/2012 | Wood et al. | |
| 2012/0139810 A1 | 6/2012 | Faraone et al. | |
| 2013/0093624 A1 | 4/2013 | Raczkowski et al. | |
| 2016/0048708 A1 | 2/2016 | Sandler et al. | |
| 2016/0054431 A1* | 2/2016 | Zou | H01Q 3/2676 |
| | | | 342/372 |
| 2017/0026096 A1 | 1/2017 | Roh et al. | |
| 2017/0029107 A1 | 2/2017 | Emami et al. | |
| 2017/0184699 A1 | 6/2017 | Honma et al. | |
| 2018/0020416 A1 | 1/2018 | Smith et al. | |
| 2018/0039154 A1 | 2/2018 | Hashemi et al. | |
| 2018/0123699 A1* | 5/2018 | Fatemi | H04B 10/613 |
| 2018/0241122 A1 | 8/2018 | Jalali et al. | |
| 2019/0056499 A1 | 2/2019 | Fatemi et al. | |
| 2019/0165448 A1* | 5/2019 | Polehn | H01Q 1/1221 |
| 2019/0361102 A1 | 11/2019 | Price et al. | |
| 2020/0106499 A1 | 4/2020 | Branlund | |
| 2020/0169306 A1 | 5/2020 | Kim et al. | |
| 2020/0192179 A1 | 6/2020 | Hajimiri | |
| 2020/0204244 A1 | 6/2020 | Hajimiri et al. | |
| 2020/0373662 A1* | 11/2020 | Gleason | G01S 17/88 |
| 2021/0105092 A1 | 4/2021 | Hajimiri et al. | |
| 2022/0189864 A1* | 6/2022 | Yazdani | H01L 25/18 |
| 2023/0155649 A1 | 5/2023 | Hajimiri et al. | |

FOREIGN PATENT DOCUMENTS

| | | | | |
|---|---|---|---|---|
| EP | 4182998 A1 | 5/2023 | | |
| WO | WO-2015135003 A2 * | 9/2015 | | G02B 27/0087 |
| WO | 2018218003 A1 | 11/2018 | | |
| WO | 2020132126 A1 | 6/2020 | | |
| WO | 2020132611 A1 | 6/2020 | | |
| WO | 2022016110 A1 | 1/2022 | | |

OTHER PUBLICATIONS

Mondal et al., "A 2-GHz Bandwidth, 0.25-1.7 ns True-Time-Delay Element Using a Variable-Order All-Pass Filter Architecture in 0.13 μm CMOS", IEEE Journal of Solid-State Circuits, Aug. 2017, vol. 52, Issue 8, pp. 2180-2193, DOI: 10.1109/JSSC.2017.2693229.

Natarajan et al., "A 77-ghz phased-array transceiver with on-chip antennas in silicon: Transmitter and local lo-path phase shifting", IEEE Journal of Solid-State Circuits, No. 12, Dec. 2006, pp. 2807-2819.

Nayak et al., "A 10-Gb/s—18.8 dBm Sensitivity 5.7 mW Fully-Integrated Optoelectronic Receiver With Avalanche Photodetector in 0.13-μm CMOS", IEEE Transactions on Circuits and Systems—I: Regular Papers, Aug. 2019, vol. 66, No. 8, pp. 3162-3173, DOI: 10.1109/TCSI.2019.2909284.

Niknejad, "Electromagnetics for High-Speed Analog and Digital Communication Circuits", Cambridge University Press, 2007, 10 pgs.

Nishio et al., "A high-speed adaptive antenna array with simultaneous multiple-beamforming capability", IEEE Transactions on Microwave Theory and Techniques, Jul. 2003, vol. 3, pp. 1673-1676, DOI:10.1109/MWSYM.2003.1210460.

Ortega et al., "Optical Beamformer for 2-D Phased Array Antenna With Subarray Partitioning Capability", IEEE Photonics Journal, vol. 8, No. 3, Jun. 2016, 9 pgs., DOI: 10.1109/JPHOT.2016.2550323.

Paciorek, "Injection locking of oscillators", Proceedings of the IEEE, Nov. 1965, vol. 53, Issue: 11, pp. 1723-1727, DOI: 10.1109/PROC.1965.4345.

Pan et al., "An 18-Gb/s Fully Integrated Optical Receiver With Adaptive Cascaded Equalizer", IEEE Journal of Selected Topics in Quantum Electronics, Nov./Dec. 2016, vol. 22, No. 6, pp. 361-369, DOI: 10.1109/JSTQE.2016.2574567.

Pancheri et al., "Low-Noise Avalanche Photodiode in Standard 0.35-μm CMOS Technology", IEEE Transactions on Electron Devices, vol. 55, Issue 1, pp. 457-461, first published Dec. 26, 2007, DOI: 10.1109/TED.2007.910570.

Pang et al., "21.1 A 28GHz CMOS Phased-Array Beamformer Utilizing Neutralized Bi-Directional Technique Supporting Dual-Polarized MIMO for 5G NR", IEEE International Solid-State Circuits Conference—(ISSCC), Feb. 2019, pp. 344-346, DOI:10.1109/ISSCC.2019.8662324.

Pang et al., "A 28-GHz CMOS Phased-Array Beamformer Utilizing Neutralized Bi-Directional Technique Supporting Dual-Polarized MIMO for 5G NR", IEEE Journal of Solid-State Circuits, Sep. 2020, vol. 55, No. 9, pp. 2371-2386, 10.1109/JSSC.2020.2995039.

Pauchard et al., "Dead space effect on the wavelength dependence of gain and noise in avalanche photodiodes", IEEE Transactions on Electron Devices, Sep. 2000, vol. 47, Issue 9, pp. 1685-1693, DOI: 10.1109/16.861578.

Payne et al., "Photonic Techniques for Local Oscillator Generation and Distribution in Millimeter-Wave Radio Astronomy", International Topical Meeting on Microwave Photonics, Nov. 2002, pp. 9-12, DOI:10.1109/MWP.2002.1158847.

Perley et al., "The Expanded Very Large Array: A New Telescope for New Science", The Astrophysical Journal Letters, Sep. 20, 2011, vol. 739, No. L1, 5 pgs., doi:10.1088/2041-8205/739/1/L1.

Poulton et al., "High-Performance Integrated Optical Phased Arrays for Chip-Scale Beam Steering and LiDAR", CLEO, Jan. 2018, 3 pgs., DOI:1364/CLEO_AT.2018.ATu3R.2.

Rajbhandari et al., "High-Speed Integrated Visible Light Communication System: Device Constraints and Design Considerations", IEEE Journal on Selected Areas in Communications, 2015, vol. 33, No. 9, pp. 1750-1757, http://dx.doi.org/10.1109/JSAC.2015.2432551.

Razavi, "A Study of Injection Locking and Pulling in Oscillators", IEEE Journal of Solid-State Circuits, Sep. 2004, vol. 39, No. 9, pp. 1415-1424, DOI: 10.1109/JSSC.2004.831608.

Rigobello et al., "Pattern recovering of conformal antenna array for strongly deformed surfaces", 2017 11th European Conference on Antennas and Propagation (EUCAP), 2017, pp. 869-871.

Sadiku et al., "Comparison of approximate formulas for the capacitance of microstrip line", Proceedings 2007 IEEE SoutheastCon, Apr. 2007, pp. 427-432, DOI:10.1109/SECON.2007.342939.

Santiccioli et al., "17.2 A 66fsrmsJitter 12.8-to-15.2GHz Fractional-N Bang-Bang PLL with Digital Frequency-Error Recovery for Fast Locking", 2020 IEEE International Solid-State Circuits Conference—(ISSCC), Feb. 16-20, 2020, pp. 268-270, DOI: 10.1109/ISSCC19947.2020.9063094.

Scaglione et al., "Opportunistic Large Arrays: Cooperative Transmission in Wireless Multihop Ad Hoc Networks to Reach Far Distances", IEEE Transactions on Signal Processing, Aug. 2003, vol. 51, No. 8, pp. 2082-2092, DOI: 10.1109/TSP.2003.814519.

Schoebel et al., "Design considerations and technology assessment of phased-array antenna systems with rf mems for automotive radar applications", IEEE Transactions on Microwave Theory and Techniques, vol. 53, No. 6, 2005, pp. 1968-1975.

Sendonaris et al., "Increasing uplink capacity via user cooperation diversity", Proceedings, 1998 IEEE International Symposium on Information Theory (Cat. No. 98CH36252), Aug. 16-21, 1998, pp. 156, DOI: 10.1109/ISIT.1998.708750.

(56) References Cited

OTHER PUBLICATIONS

Sendonaris et al., "User Cooperation Diversity—Part 1: System Description", IEEE Transactions on Communications, Nov. 2003, vol. 51, No. 11, pp. 1927-1938, DOI: 10.1109/TCOMM.2003. 818096.

Sendonaris et al., "User Cooperation Diversity—Part II: Implementation Aspects and Performance Analysis", IEEE Transactions on Communications, Nov. 2003, vol. 51, No. 11, pp. 1939-1948, DOI:10.1109/TCOMM.2003.819238.

Sengupta et al., "A 0.28 thz power-generation and beamsteering array in cmos based on distributed active radiators", IEEE Journal of Solid-State Circuits, vol. 47, No. 12, pp. 3013-3031, 2012.

Seong et al., "Conformal array pattern synthesis on a curved surface with quadratic function using adaptive genetic algorithm", 2013 Asia-Pacific Microwave Conference (APMC), 2013, pp. 167-169.

Shahramian et al., "A Fully Integrated 384-Element, 16-Tile, W-Band Phased Array With Self-Alignment and Self-Test", IEEE Journal of Solid-State Circuits, Sep. 2019, first published Aug. 6, 2019, vol. 54, Issue 9, pp. 2419-2434, DOI: 10.1109/JSSC.2019.2928694.

Shillue et al., "The ALMA photonic local oscillator system", in 2011 URSI General Assembly and Scientific Symposium, IEEE, Aug. 2011, 4 pgs., https://doi.org/10.1109/ursigass.2011.6051254.

Shipley et al., "Mutual coupling-based calibration of phased array antennas", Proceedings 2000 IEEE International Conference on Phased Array Systems and Technology (Cat. No. 00TH8510), 2000, pp. 529-532.

Skolnik, "Radar Handbook", Second Edition, McGraw-Hill, 1990, 36 pgs.

Sohrabi et al., "Hybrid Digital and Analog Beamforming Design for Large-Scale Antenna Arrays", arXiv.org, Retrieved from: https://arxiv.org/abs/1601.06814v1, Jan. 25, 2016, 13 pgs.

Strobel et al., "Communication in automotive systems: Principles, limits and new trends for vehicles, airplanes and vessels", 2010 12th International Conference on Transparent Optical Networks, Aug. 16, 2010, pp. 1-6, DOI: 10.1109/ICTON.2010.5549163.

Tao et al., "An overview of cooperative communications", IEEE Communications Magazine, Jun. 6, 2012, vol. 50, Issue 6, pp. 65-71, DOI: 10.1109/MCOM.2012.6211487.

Tsinos et al., "On the Energy-Efficiency of Hybrid Analog-Digital Transceivers for Single- and Mutli-carrier Large Antenna Array Systems", IEEE Journal on Selected Areas in Communications, vol. 35, No. 9, Sep. 2017, Electronic Publication: Jun. 28, 2017, 16 pgs.

Van Overstraeten et al., "Measurement of the ionization rates in diffused silicon p—n junctions", Solid-State Electronics, May 1970, vol. 13, Issue 5, pp. 583-608, https://doi.org/10.1016/0038-1101(70)90139-5.

Vaskelaninen, "Iterative least-squares synthesis methods for conformal array antennas with optimized polarization and frequency properties", IEEE Transactions on Antennas and Propagation, vol. 45, No. 7, 1997, pp. 1179-1185.

Vorontsov et al., "Adaptive phase-distortion correction based on parallel gradient-descent optimization", Optics Letters, vol. 22, No. 12, Jun. 15, 1997, pp. 907-909.

Williams et al., "Origami-inspired shape-changing phased array", 2020 50th European Microwave Conference (EuMC), Utrecht, The Netherlands, Jan. 2021, pp. 344-347.

Xu et al., "Spectral and Energy Efficiency of Multi-pair Massive MIMO Relay Network with Hybrid Processing", arXiv.org, Retrieved from: https://arxiv.org/abs/1706.06743v2, Jun. 25, 2017, 15 pgs.

Yang et al., "Digital beamforming-based massive mimo transceiver for 5g millimeter-wave communications", IEEE Transactions on Microwave Theory and Techniques, vol. 66, No. 7, 2018, pp. 3403-3418.

You et al., "A 12GHz 67% tuning range 0.37pS RJrms PLL with LC-VCO temperature compensation scheme in 0.13 μm CMOS", IEEE Radio Frequency Integrated Circuits Symposium, Jun. 2014, pp. 101-104, DOI: 10.1109/RFIC.2014.6851669.

Yuan et al., "A new look at impact ionization—Part II: Gain and noise in short avalanche photodiodes", IEEE Transactions on Electron Devices, Sep. 1999, vol. 46, No. 8, pp. 1632-1639, DOI:10. 1109/16.777151.

Yuan et al., "A Simple Formula for the Estimation of the Capacitance of Two-Dimensional Interconnects in VLSI Circuits", IEEE Electron Device Letters, Dec. 1982, vol. EDL-3, No. 12, pp. 391-393, DOI: 10.1109/EDL.1982.25610.

Zhang et al., "Hybridly-Connected Structure for Hybrid Beamforming in mmWave MIMO Systems", IEEE Transactions on Communications, vol. 66, No. 2, Feb. 2018, 13 pgs., DOI: 10.1109/TCOMM. 2017.2756882.

International Preliminary Report on Patentability for International Application PCT/US2019/067262, Report dated Jun. 16, 2021, dated Jul. 1, 2021, 9 pgs.

International Preliminary Report on Patentability for International Application PCT/US2019/068115, Report dated Jun. 16, 2021, dated Jul. 1, 2021, 13 pgs.

International Preliminary Report on Patentability for International Application PCT/US2021/042069, Report dated Jan. 17, 2023, dated Jan. 26, 2023, 8 pgs.

International Search Report and Written Opinion for International Application No. PCT/US2021/042069, Search completed Nov. 5, 2021, dated Nov. 5, 2021, 10 pgs.

International Search Report and Written Opinion for International Application No. PCT/US2019/067262, Search completed Feb. 21, 2020, dated Mar. 19, 2020, 13 pgs.

International Search Report and Written Opinion for International Application No. PCT/US2019/068115, Search completed Feb. 13, 2020, dated Mar. 18, 2020, 18 pgs.

"Altera: Time Delay Digital Beamforming", Altera Corporation, Reference Design Datasheet, Retrieved from: https://www.intel.cn/content/dam/www/programmable/us/en/pdfs/literature/ds/time_delay_digita_beamforming_11.pdf, Apr. 2014, 1 pg.

Abbas, "Beamforming Techniques for Millimeter Wave Relay Networks", PhD Thesis, University of Manchester, 2017, 168 pgs.

Abiri et al., "A 1-D Heterodyne Lens-Free Optical Phased Array Camera With Reference Phase Shifting", IEEE Photonics Journal, vol. 10, No. 5, Sep. 2018, 13 pgs., DOI:10.1109/JPHOT.2018. 2871823.

Aflatouni et al., "Nanophotonic projection system", Optical Society of America, Aug. 4, 2015, 11 pgs., DOI:10.1364/OE.23.021012.

Agrawal, "Fiber-Optic Communication Systems", Wiley Interscience, 2002, 563 pgs., presented in two parts.

Ahmed et al., "A Survey on Hybrid Beamforming Techniques in 5G: Architecture and System Model Perspectives", IEEE Communications Surveys & Tutorials, vol. 20, No. 4, Fourth Quarter 2018, Jun. 4, 2018, pp. 3060-3097.

Akiba et al., "Photonic Architecture for Beam Forming of RF Phased Array Antenna", Optical Fiber Communication Conference, OSA Technical DigestMar. 2014, 3 pgs., https://doi.org/10.1364/OFC.2014.W2A.51.

Akima et al., "A 10 GHz frequency-drift temperature compensated LC VCO with fast-settling low-noise voltage regulator in 0.13 μm CMOS", Proceedings of the Custom Integrated Circuits Conference, Oct. 2010, pp. 1-4, DOI:10.1109/CICC.2010.5617448.

Allard et al., "Radiation pattern synthesis for arrays of conformal antennas mounted on arbitrarily-shaped three-dimensional platforms using genetic algorithms", IEEE Transactions on Antennas and Propagation, vol. 51, No. 5, May 2003, pp. 1054-1062.

Bailin et al., "The radiation field produced by a slot in a large circular cylinder", IRE Transactions on Antennas and Propagation, vol. 3, No. 3, 1955, pp. 128-137, 1955.

Beas et al., "Millimeter-Wave Frequency Radio over Fiber Systems: A Survey", IEEE Communications Surveys & Tutorials, Mar. 2013, vol. 15, No. 4, pp. 1593-1619, DOI 10.1109/SURV.2013.013013. 00135.

Bekers et al., "Mutual-coupling based phased-array calibration: A robust and versatile approach", 2013 IEEE International Symposium on Phased Array Systems and Technology, 2013, pp. 630-637.

Braaten et al., "A self-adapting flexible (selflex) antenna array for changing conformal surface applications", IEEE Transactions on Antennas and Propagation, vol. 61, No. 2, 2013, pp. 655-665.

(56) References Cited

OTHER PUBLICATIONS

Brautigam et al., "TerraSAR-X instrument calibration results and extension for tandem-x", IEEE Transactions on Geoscience and Remote Sensing, vol. 48, No. 2, 2010, pp. 702-715.
Chang et al., "A temperature compensated VCO using feed-forward gain multiplication for cellular applications", IEEE Radio Frequency Integrated Circuits Symposium (RFIC), May 2015, pp. 187-190, DOI: 10.1109/RFIC.2015.7337736.
Cho et al., "A True Time Delay-Based SiGe Bi-directional T/R Chipset for Large-Scale Wideband Timed Array Antennas", IEEE Radio Frequency Integrated Circuits Symposium (RFIC), Jun. 2018, pp. 272-275, DOI:10.1109/RFIC.2018.8428977.
Chu et al., "A True Time-Delay-Based Bandpass Multi-Beam Array at mm-Waves Supporting Instantaneously Wide Bandwidths", 2010 IEEE International Solid-State Circuits Conference (ISSCC), Feb. 7-11, 2010, pp. 38-40.
Chu et al., "True-Time-Delay-Based Multi-Beam Arrays", IEEE Transactions on Microwave Theory and Techniques, Aug. 2013, vol. 61, Issue 8, pp. 3072-3082, DOI: 10.1109/TMTT.2013.2271119.
Chung et al., "A 1024-Element Scalable Optical Phased Array in 0.18 SOI CMOS", 2017 International Solid-State Circuits Conference, 2017, 12 pgs., DOI: 10.1109/ISSCC.2017.7870361.
Cripps, "RF power amplifiers for wireless communications", Boston: Artech House, 2006, 473 pgs., presented in two parts.
Debaes et al., "High-impedance high-frequency silicon detector response for precise receiverless optical clock injection", Proceedings of the SPIE, Mar. 27, 2002, vol. 4654, pp. 78-88, https://doi.org/10.1117/12.463842.
Dimas et al., "Cooperative Beamforming with Predictive Relay Selection for Urban mmWave Communications", IEEE Access, 2016, vol. 4, pp. 157057-157071, DOI: 10.1109/ACCESS.2017. DOI.
Dokmanic et al., "Euclidean distance matrices: Essential theory, algorithms, and applications", IEEE Signal Processing Magazine, vol. 32, No. 6, Nov. 2015, pp. 17 pgs.
Dunworth et al., "A 28GHz Bulk-CMOS dual-polarization phased-array transceiver with 24 channels for 5G user and basestation equipment", 2018 IEEE International Solid—State Circuits Conference—(ISSCC), Feb. 2018, pp. 70-72, DOI: 10.1109/ISSCC.2018.8310188.
Eberle et al., "The flared slot: A moderately directive flush-mounted broad-band antenna", IRE Transactions on Antennas and Propagation, vol. 8, No. 5, 1960, pp. 461-468.
Fatemi et al., "A nonuniform sparse 2-D large-FOV optical phased array with a low-power PWM drive", IEEE Journal of Solid-State Circuits, vol. 54, No. 5, May 2019, pp. 1200-1215.
Fatemi et al., "High sensitivity active flat optics optical phased array receiver with a two-dimensional aperture", Optics Express, vol. 26, No. 23, Nov. 12, 2018, 17 pgs., https://doi.org/10.1364/OE.26.029983.
Fikes et al., "A framework for array shape reconstruction through mutual coupling", IEEE Transactions on Microwave Theory and Techniques, 2021, 15 pgs.
Fikes et al., "Flexible, conformal phased arrays with dynamic array shape self-calibration", 2019 IEEE IMS, 2019, pp. 1458-1461.
Gal-Katziri et al., "A 28 GHz Optically Synchronized CMOS Phased Array with an Integrated Photodetector", IEEE Radio Frequency Integrated Circuits Symposium (RFIC), Jun. 2021, 4 pgs., DOI:10.1109/RFIC51843.2021.9490452.
Gal-Katziri et al., "A Sub-Picosecond Hybrid DLL for Large-Scale Phased Array Synchronization", IEEE Asian Solid-State Circuits Conference (A-SSCC), 2018, pp. 231-234, DOI: 10.1109/ASSCC.2018.8579340.
Gal-Katziri et al., "Scalable, deployable, flexible phased array sheets", 2020 IEEE/MTT-S International Microwave Symposium (IMS), 2020, pp. 1085-1088.
Gao, "High-resolution phased array radar imaging by photonics-based broadband digital beamforming", Optics Express, Apr. 29, 2019, vol. 27, No. 9, pp. 13194-13203, doi: 10.1364/OE.27.013194.
Garakoui et al., "Compact Cascadable gm-C All-Pass True Time Delay Cell with Reduced Delay Variation over Frequency", IEEE Journal of Solid-State Circuits, Mar. 1, 2015, first published Feb. 15, 2014, vol. 50, No. 3, pp. 693-703, DOI: 10.1109/JSSC.2015.2390214.
Gardner, "Charge-pump phase-lock loops", IEEE Transactions on Communications, Nov. 1980, vol. COM-28, pp. 1849-1858, DOI: 10.1109/TCOM.1980.1094619.
Gaudino et al., "Perspective in Next-Generation Home Networks: Toward Optical Solutions?", IEEE Communications Magazine, Feb. 2010, vol. 48, No. 2. pp. 39-47, DOI:10.1109/MCOM.2010.5402662.
Ghaderi et al., "An Integrated Discrete-Time Delay Compensating Technique for Large-Array Beamformers", IEEE Transactions on Circuits and Systems—I: Regular Papers, Sep. 2019, vol. 66, No. 9, pp. 3296-3306, DOI: 10.1109/TCSI.2019.2626309.
Goodman et al., "Optical interconnections for VLSI systems", Proceedings of the IEEE, Jul. 1984, vol. 72, Issue 7, pp. 850-866, DOI: 10.1109/PROC.1984.12943.
Hajimiri et al., "Dynamic Focusing of Large Arrays for Wireless Power Transfer and Beyond", IEEE Journal of Solid-State Circuits, Nov. 2020, 25 pgs., DOI: 10.1109/JSSC.2020.3036895.
Hajimiri et al., "Integrated Phased Array Systems in Silicon", IEEE Communications Magazine, Sep. 2005, vol. 93, Issue 9, pp. 1637-1655, DOI: 10.1109/JPROC.2005.852231.
Hajimiri et al., "Phased Array Systems in Silicon", Topics in Circuits for Communications, IEEE Communications Magazine, Aug. 2004, vol. 42, No. 8, pp. 122-130.
Hashemi et al., "A flexible phased array system with low areal mass density", Nature Electronics, May 17, 2019, vol. 2, pp. 195-205, DOI https://doi.org/10.1038/s41928-019-0247-9.
Haupt, "Genetic algorithm applications for phased arrays", Applied Computational Electromagnetics Society Journal, vol. 21, No. 3, Nov. 2006, pp. 325-336.
Havary-Nassab et al., "Distributed Beamforming for Relay Networks Based on Second-Order Statistics of the Channel State Information", IEEE Transactions on Signal Processing, Sep. 2008, vol. 56, Issue 9, pp. 4306-4316, DOI: 10.1109/TSP.2008.925945.
Haykin et al., "Modern Wireless Communication", 1st ed. New Jersey: Prentice Hall, 2004, 289 pgs., presented in two parts.
He et al., "Long-distance telecom-fiber transfer of a radio-frequency reference for radio astronomy", Optica, Feb. 2018, vol. 5, Issue 2, pp. 138-146, https://doi.org/10.1364/OPTICA.5.000138.
Hong et al., "A General Theory of Injection Locking and Pulling in Electrical Oscillators—Part I: Time-Synchronous Modeling and Injection Waveform Design", IEEE Journal of Solid-State Circuits, Aug. 2019, vol. 54, Issue 8, pp. 2109-2121, DOI: 10.1109/JSSC.2019.2908753.
Hong et al., "Multibeam Antenna Technologies for 5G Wireless Communications", IEEE Transactions on Antennas and Propagation, Dec. 2017, vol. 65, Issue 12, pp. 6231-6249, DOI: 10.1109/TAP.2017.2712819.
Horvat, "True Time Domain Bandpass Beamforming", Thesis, Master of Applied Science, Engineering Science, Simon Fraser University, 1998, 104 pgs.
Hu et al., "A 21.7-26.5GHz Charge-Sharing Locking Quadrature PLL with Implicit Digital Frequency Tracking Loop Achieving 75fs Jitter and -250dB FoM", 2020 IEEE International Solid-State Circuits Conference, Feb. 2020, pp. 276-278, DOI:10.1109/ISSCC19947.2020.9063024.
Huang et al., "A Mm-Wave Wideband MIMO RX With Instinctual Array-Based Blocker/Signal Management for Ultralow-Latency Communication", IEEE Journal of Solid-State Circuits, Dec. 2019, first published Oct. 24, 2019, vol. 54, Issue 12, pp. 3553-3564, DOI: 10.1109/JSSC.2019.2945267.
Huang et al., "Microfluidic serpentine antennas with designed mechanical tunability", Lab on a Chip, Issue No. 21, 2014, pp. 4205-4212.
Jang et al., "A 1-GHz 16-Element Four-Beam True-Time-Delay Digital Beamformer", IEEE Journal of Solid-State Circuits, 2019, vol. 54, No. 5, pp. 1304-1314, DOI:10.1109/JSSC.2019.2894357.

(56) References Cited

OTHER PUBLICATIONS

Jang et al., "A True Time Delay 16-Element 4-Beam Digital Beamformer", 2018 IEEE Radio Frequency Integrated Circuits Symposium (RFIC), Jun. 10-12, 2018, pp. 12-15.
Jeon et al., "A Scalable 6-to-18 GHz Concurrent Dual-Band Quad-Beam Phased-Array Receiver in CMOS", IEEE Journal of Solid-State Circuits, Jan. 2009, vol. 43, No. 12, pp. 2660-2673, DOI:10.1109/JSSC.2008.2004863.
Jing et al., "Network Beamforming Using Relays with Perfect Channel Information", IEEE Transactions on Information Theory, 2009, vol. 55, No. 6, Apr. 7, 2008, 33 pgs., arXiv:0804.1117 [cs.IT].
Jones et al., "A wide-band transverse-slot flush-mounted array", IRE Transactions on Antennas and Propagation, vol. 8, No. 4, 1960, pp. 401-407.
Josefsson et al., "Conformal Array Antenna Theory and Design", IEEE Press Series on Electromagnetic Wave Theory, 2006, 488 pgs., presented in two parts.
Kalia et al., "A Simple, Unified Phase Noise Model for Injection-Locked Oscillators", IEEE Radio Frequency Integrated Circuits Symposium, Jun. 2011, 3 pgs., DOI: 10.1109/RFIC.2011.5940707.
Kang et al., "Low-cost multistandard radio-over-fiber downlinks based on CMOS-compatible Si avalanche photodetectors", IEEE Photonics Technology Letters, May 2009, vol. 21, No. 7, pp. 462-464, DOI:10.1109/LPT.2009.2013356.
Kaukovuori et al., "Analysis and Design of Passive Polyphase Filters", IEEE Transactions on Circuits and Systems I: Regular Papers, Feb. 7, 2008, vol. 55, No. 10, pp. 3023-3037, DOI: 10.1109/TCSI.2008.917990.
Kern, "PLL-Based Active Optical Clock Distribution", Thesis, Sep. 2004, 105 pgs.
Kobayashi, "Simple calculation method for conformal beam-scanning array pattern", 2019 13th European Conference on Antennas and Propagation (EuCAP), 2019, pp. 1-5.
Komljenovic et al., "On-chip calibration and control of optical phased arrays", Optics Express, vol. 26, No. 3, Feb. 5, 2018, 12 pgs., https://doi.org/10.1364/OE.26.003199.
Kutty et al., "Beamforming for Millimeter Wave Communications: An Inclusive Survey", IEEE Communications Surveys & Tutorials, vol. 18, No. 2, Second Quarter 2016, Electronic Publication: Dec. 1, 2015, pp. 949-973, DOI: 10.1109/COMST.2015.2504600.
Laneman et al., "An efficient protocol for realizing cooperative diversity in wireless networks", Proceedings, 2001 IEEE International Symposium on Information Theory (IEEE Cat. No. 01CH37252), Jun. 24-29, 2001, p. 294, DOI:10.1109/ISIT.2001.936157.
Lau et al., "Ultra-Stable RF-Over-Fiber Transport in NASA Antennas, Phased Arrays and Radars", Journal of Lightwave Technology, Oct. 15, 2014, vol. 32, Issue:20, pp. 3440-3451, DOI: 10.1109/JLT.2014.2312930.
Lee et al., "A silicon avalanche photodetector fabricated with standard CMOS technology with over 1 THz gain-bandwidth product", Optics Express, Nov. 2010, vol. 18, No. 23, pp. 24189-24194, DOI:10.1364/OE.18.024189.
Lee et al., "Optical-Power Dependence of Gain, Noise, and Bandwidth Characteristics for 850-nm CMOS Silicon Avalanche Photodetectors", IEEE Journal of Selected Topics in Quantum Electronics, Nov.-Dec. 2014, vol. 20, Issue 6, pp. 211-217, DOI:10.1109/JSTQE.2014.2327796.
Lee et al., "Performance Optimization and Improvement of Silicon Avalanche Photodetectors in Standard CMOS Technology", IEEE Journal of Selected Topics in Quantum Electronics, Mar.-Apr. 2018, vol. 24, Issue 2. pp. 1-13, DOI: 10.1109/JSTQE.2017.2754359.
Leu et al., "Injection-locked clock receiver for monolithic optical link in 45nm SOI", IEEE Asian Solid-State Circuits Conference, Nov. 2011, pp. 149-152, DOI: 10.1109/ASSCC.2011.6123624.
Liu et al., "A Temperature Compensated Triple-Path PLL With $K_{vco}$ Non-Linearity Desensitization Capable of Operating at 77 K", IEEE Transactions on Circuits and Systems I: Regular Papers, May 2017, vol. 64, No. 11, pp. 1-9, DOI:10.1109/TCSI.2017.2704023.
Matsko, "Advances in the Development of Spectrally Pure Microwave Photonic Synthesizers", IEEE Photonics Technology Letters, Dec. 1, 2019, vol. 31, Issue 23, pp. 1882-1885, DOI: 10.1109/LPT.2019.2947901.
McIntosh et al., "Fopair: a focused array imaging radar for ocean remote sensing", IEEE Transactions on Geoscience and Remote Sensing, vol. 33, No. 1, 1995, pp. 115-124.
McIntrye, "The distribution of gains in uniformly multiplying avalanche photodiodes: Theory", IEEE Transactions on Electron Devices, Jun. 1972, vol. 19, Issue 6, pp. 703-713, DOI: 10.1109/T-ED.1972.17485.
McIntyre, "A new look at impact ionization—Part I: A theory of gain, noise, breakdown probability, and frequency response", IEEE Transactions on Electron Devices, Aug. 1999, vol. 46, Issue 8, pp. 1623-1631, DOI: 10.1109/16.777150.
McIntyre, "Multiplication noise in uniform avalanche diodes", IEEE Transactions on Electron Devices, Jan. 1966, vol. ED-13, issue 1, pp. 164-168, DOI: 10.1109/T-ED.1966.15651.
Mercandelli et al., "17.5 A 12.5GHz Fractional-N Type-I Sampling PLL Achieving 58fs Integrated Jitter", 2020 IEEE International Solid-State Circuits Conference—(ISSCC), Feb. 16-20, 2020, pp. 274-276, DOI:10.1109/ISSCC19947.2020.9063135.

\* cited by examiner

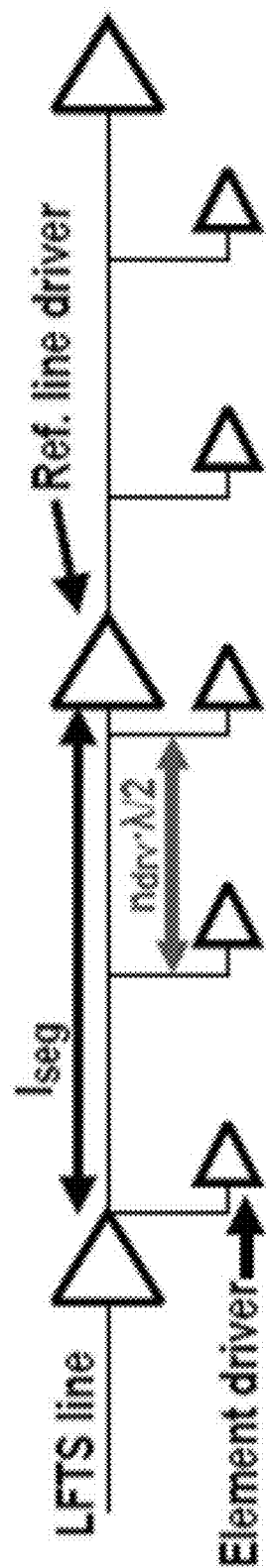

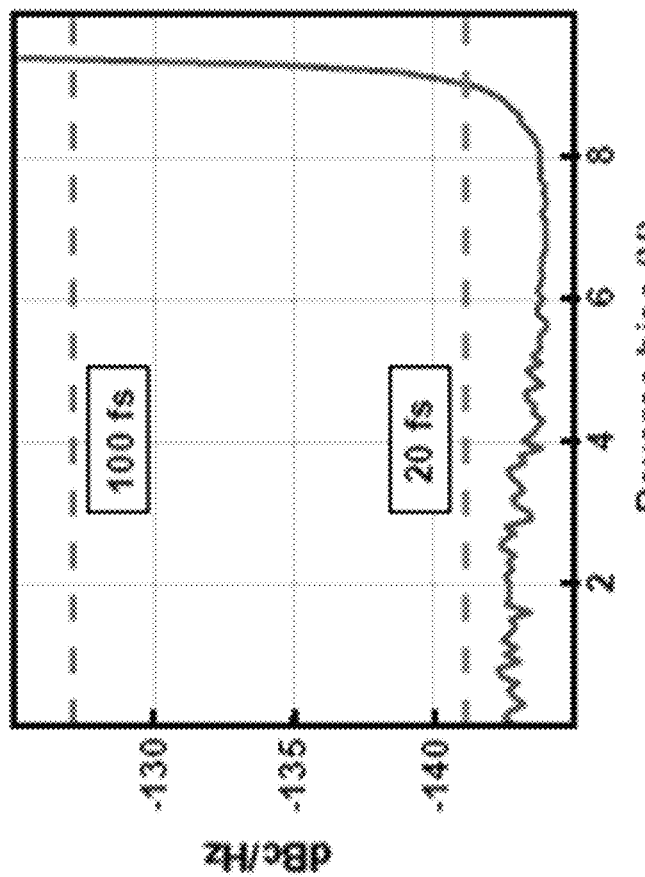
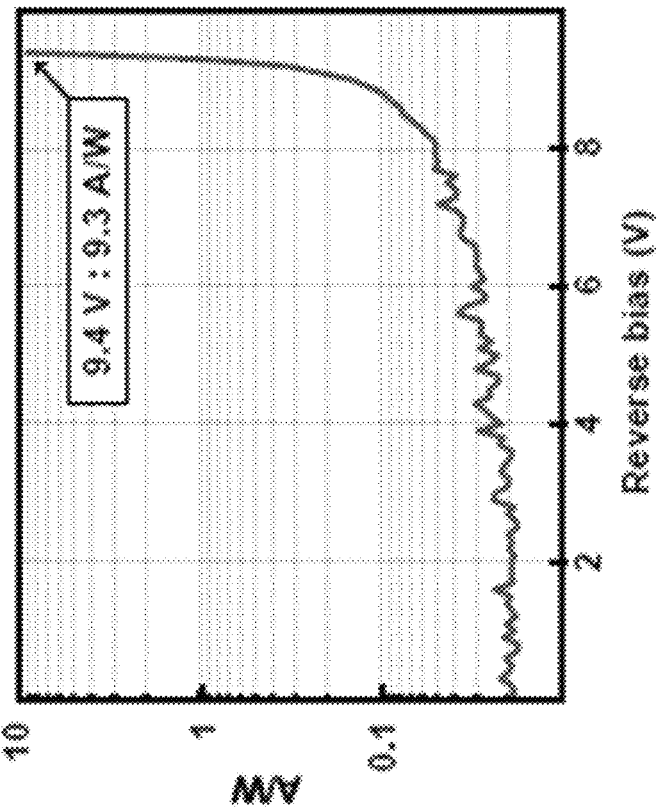
Fig. 10A
Fig. 10B

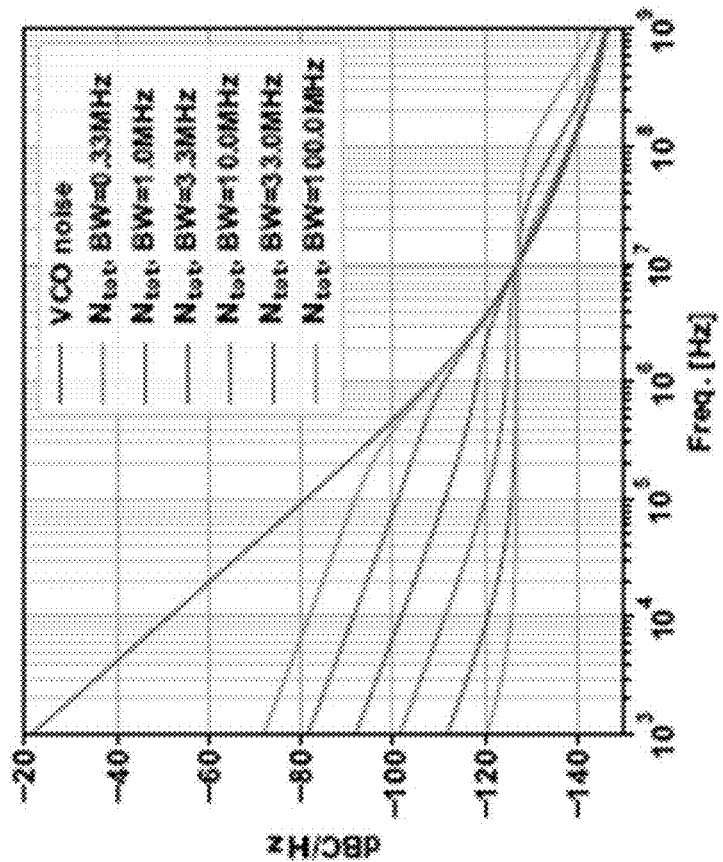
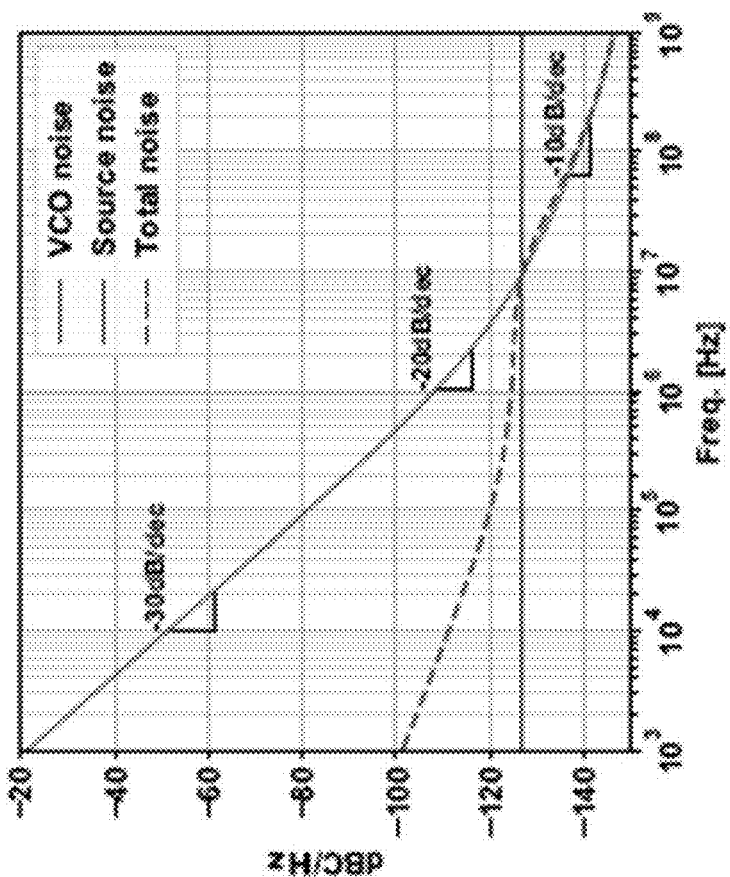
Fig. 12B
Fig. 12A

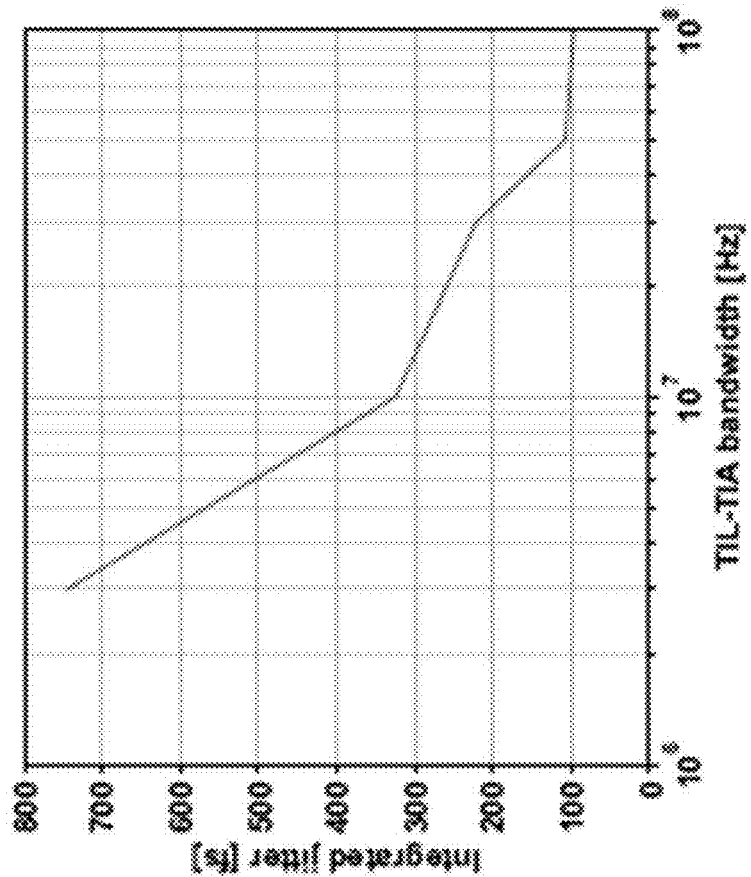
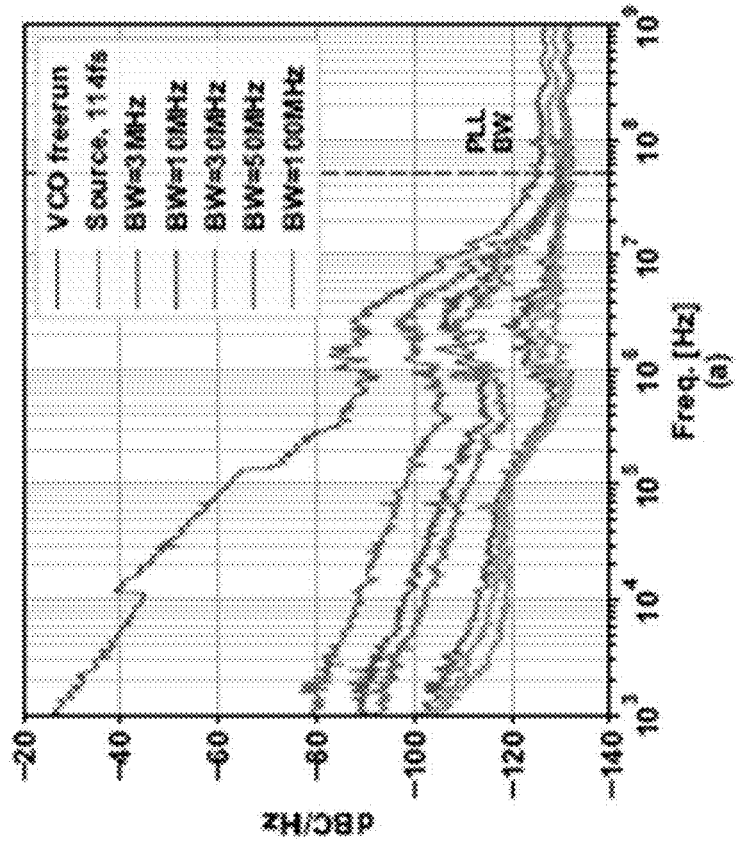
Fig. 14A
Fig. 14B

OPTICALLY SYNCHRONIZED PHASED ARRAY

CROSS-REFERENCE TO RELATED APPLICATIONS

This application claims the benefit of and priority under 35 U.S.C. § 119(e) to U.S. Provisional Patent Application Ser. No. 63/053,438 entitled "Optical Synchronization of Electronic Timing Circuits" and filed Jul. 17, 2020 and U.S. Provisional Patent Application Ser. No. 63/214,524 entitled "Optically Synchronized Phased Array" and filed Jun. 24, 2021, the disclosures of which are incorporated herein by reference in their entirety for all purposes.

FIELD OF THE INVENTION

The present invention generally relates to processes for synchronizing radiating elements within a synchronized large array.

BACKGROUND

Multiple-antenna phased arrays and beamforming technologies have experienced a massive transition from their traditional scientific and defense applications to commercial infrastructure and consumer products—from cellular communications to automotive radars. While the steering and power focusing capabilities of phased arrays scale favorably with an increase in their size, electrically synchronization between elements becomes more challenging. Methods for low-cost electrical synchronization through CMOS compatible distribution of reference clocks are typically used but may rely on local synthesis and suffer from buffer and synthesizer noise multiplication. Clock distribution at RF frequencies, can be prohibitively expensive and power hungry due to conductor and splitting losses. Neither electrical synchronization nor clock distribution at RF frequencies scales well with the size, span, or operation frequency of the array.

SUMMARY OF THE INVENTION

Various embodiments are directed to a phased antenna array including:
  an optical timing source; and
  a plurality of sub-arrays configured to transmit a signal, wherein each sub-array comprises:
    an integrated circuit;
    at least one antenna element controlled by the integrated circuit;
    a photo diode configured to receive a shared optical timing signal from the optical timing source and generate a timing information signal;
    an amplifier configured to receive the timing information signal from the photo diode; and
    a phase-locked loop connected to the amplifier and configured to generate an electronic synchronization signal which is distributed to one or more channels.

In various other embodiments, each channel is connected to an antenna configured to broadcast the signal.

In still various other embodiments, the antennas are located on a modular printed circuit board and the integrated circuit is a flip chip bonded to the modular printed circuit board.

In still various other embodiments, each sub-array further includes a resonant circuit connected in parallel with the photo diode.

In still various other embodiments, the resonant circuit includes an inductor and a capacitor which establishes resonant behavior in which energy oscillates between storage in the inductor and storage in the capacitor.

In still various other embodiments, the capacitor, inductor, and photo diode are all directly connected to the amplifier.

In still various other embodiments, the resonant circuit produces an injection locked amplifier.

In still various other embodiments, the capacitor and the inductor are located on the integrated circuit.

In still various other embodiments, the integrated circuit includes the photo diode.

In still various other embodiments, the integrated circuit includes the amplifier.

In still various other embodiments, the integrated circuit includes the phase-locked loop.

In still various other embodiments, the integrated circuit includes the photo diode, the amplifier, and the phase-locked loop.

In still various other embodiments, the shared optical timing signal is distributed to each photo diode using optical fibers or through free space using a laser beam.

In still various other embodiments, the optical fibers are held in place by an optical fiber holder which holds the output of the optical fibers in optical connection with the photo diode.

In still various other embodiments, the optical fibers are optically connected with the photo diode through a via hole in the modular printed circuit board.

In still various other embodiments, the optical fiber holder is held in place by a bottom board which is rigidly connected to headers.

In still various other embodiments, the headers support the modular printed circuit board.

In still various other embodiments, the headers and bottom board distribute power and communication signals to the modules.

In still various other embodiments, the one or more channels perform beamforming and/or data transfer.

In still various other embodiments, the one or more channels have independently controlled phase amplitudes.

In still various other embodiments, adjacent modules are spaced apart to create a sparse array.

In still various other embodiments, the photo diode comprises: an N-well; a P-well electrically connected with the N-well to form a PN junction; an N-well contact in electrical connection with the N-well; and a P-well contact in electrical connection with the P-well, wherein the N-well contact and P-well contact are separated through a shallow trench isolation.

Further, various embodiments are directed to a phased antenna array including:
  an optical synchronization source; and
  a plurality of sub-arrays,
  wherein each sub-array:
    receives optical timing information from the optical synchronization source,
    generates the electrical timing information based on the optical timing information received from the optical synchronization source, and
    provides electrical timing information to multiple antenna elements.

In various other embodiments, each sub-array includes one or more channels which each control an antenna.

In still various other embodiments, the one or more channels perform beamforming and/or data transfer.

Further, various embodiments are directed to an optically synchronized integrated circuit comprising: a photo diode configured to receive a shared optical timing signal and generate a timing information signal; an amplifier configured to receive the timing information signal from the photo diode; and a phase-locked loop connected to the amplifier and configured to generate an electronic synchronization signal which is distributed to one or more channels.

In various other embodiments, each channel is connected to an antenna configured to broadcast the signal.

In still various other embodiments, the optically synchronized integrated circuit further includes a resonant circuit connected in parallel with the photo diode.

In still various other embodiments, the resonant circuit comprises an inductor and a capacitor which establishes resonant behavior in which energy oscillates between storage in the inductor and storage in the capacitor.

In still various other embodiments, the capacitor, inductor, and photo diode are all directly connected to the amplifier.

In still various other embodiments, the photo diode includes: an N-well; a P-well electrically connected with the N-well to form a PN junction; an N-well contact in electrical connection with the N-well; and a P-well contact in electrical connection with the P-well, wherein the N-well contact and P-well contact are separated through a shallow trench isolation.

BRIEF DESCRIPTION OF THE DRAWINGS

The description will be more fully understood with reference to the following figures and data graphs, which are presented as various embodiment of the disclosure and should not be construed as a complete recitation of the scope of the disclosure.

FIG. 3C conceptually illustrates operation of an LFTS clock distribution system.

FIG. 10A illustrates an example CMOS photodiode responsivity, measured at 780 nm with approximately −25 dBm input power.

FIG. 10B illustrates a CMOS photodiode tank noise output.

FIG. 12A illustrates an example TIL-TIA noise output under injection with an SNR floor of −128 dBC.

FIG. 12B illustrates TIL-TIA noise output combined VCO and source noise as a function of TIL-TIA loop bandwidth.

FIG. 14A illustrates an example measured TIL-TIA noise output under variable injection strength.

FIG. 14B illustrates an example measured TIL-TIA noise output integrated up to 50 MHz vs the lock range.

DETAILED DESCRIPTION

Turning now to the drawings, phased array systems incorporating optical timing synchronization (OTS) and systems for performing OTS in accordance with various embodiments of the invention are illustrated. In several embodiments, the OTS modulates timing information using an optical carrier that is distributed to various sub-arrays across a large span phased array. In some embodiments, the phased array systems include a plurality of sub-arrays. Each sub-array may include a complete and functional optically synchronized integrated circuit including an integrated photo diode. Advantageously, integrating the photo diode into the integrated circuit may reduce the size of the sub-array and decrease the length the high frequency timing signal is passed.

In some embodiments, each sub-array further includes a resonant circuit connected in parallel with the photo diode. In some embodiments, the resonant circuit includes an inductor and a capacitor that establish resonant behavior in which energy oscillates between storage in the inductor and storage in the capacitor.

In some embodiments, the photo diode may be a CMOS photodiode integrated into the integrated circuit. In a number of embodiments, the CMOS photodiode includes an N-well; a P-well electrically connected with the N-well to form a PN junction; an N-well contact in electrical connection with the N-well; and a P-well contact in electrical connection with the P-well. In certain embodiments, the N-well contact and P-well contact are electrically separated through a shallow trench isolation.

Phased arrays incorporating OTS and OTS systems in accordance with various embodiments of the invention are discussed further below.

Optical Synchronization within Phased Arrays

Figure 1A:
FIG. 1A conceptually illustrates a large network of phased array antennas in accordance with an embodiment of the invention.
Figure 1B:
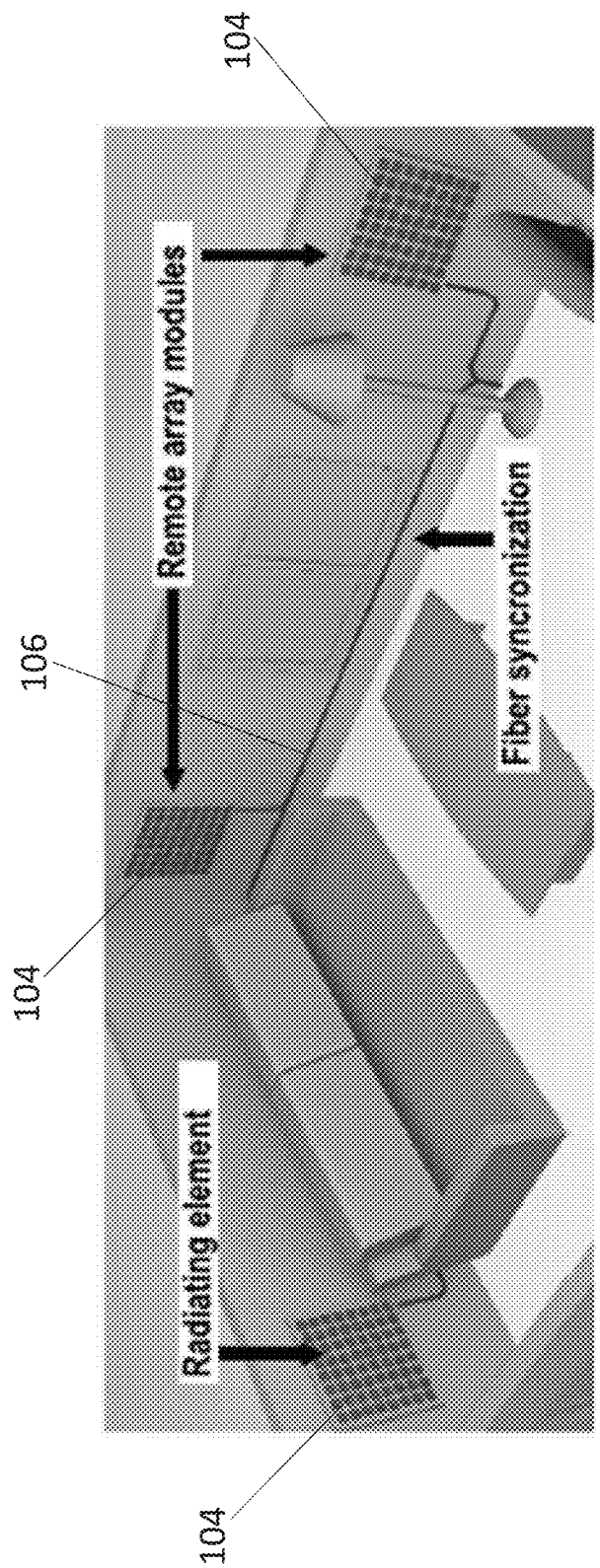
FIG. 1B conceptually illustrates a distributed phased array capable of being utilized for wireless power transfer and/or digital communication in accordance with an embodiment of the invention.
Figure 1C:
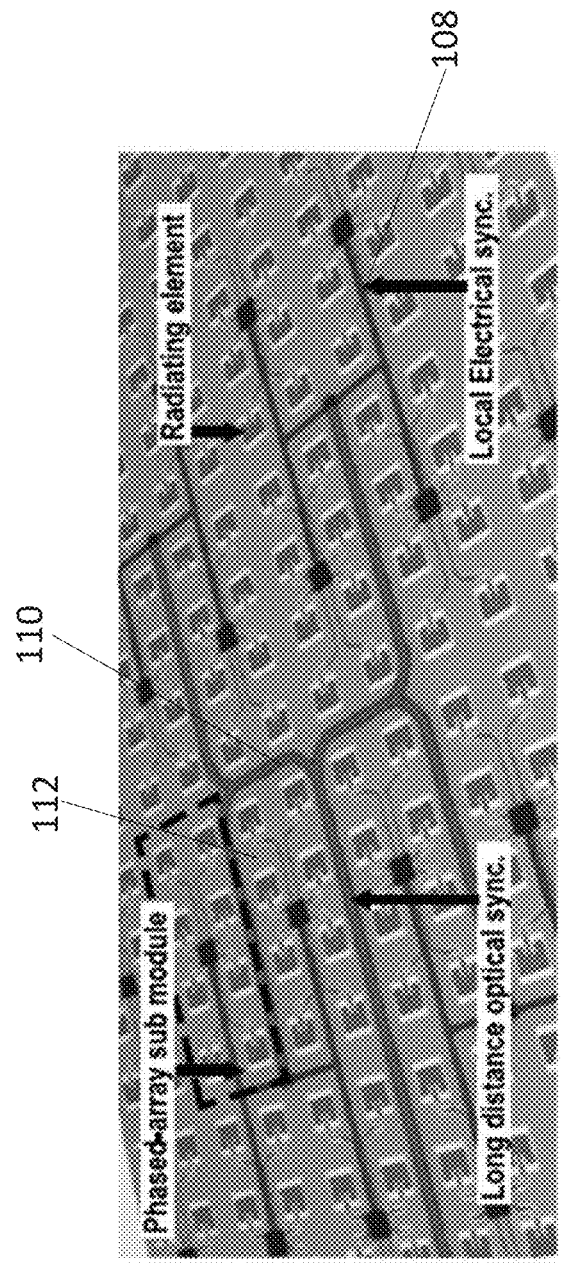
FIG. 1C conceptually illustrates a large-scale phased array combining optical synchronization across the array and electrical synchronization within phased array sub modules in accordance with an embodiment of the invention.

Various examples for phased arrays that utilize OTS in accordance with certain embodiments of the invention are conceptually illustrated FIGS. 1A, 1B, and 1C. FIG. 1A illustrates an example of a large network of phased array antennas 102 in accordance with an embodiment of the invention. The large network of phased array antennas 102 may send and/or receive a signal in a distributed manner. Each antenna 102 may be made up of multiple antenna elements which may cooperate to send and/or receive the signal. In some embodiments, each antenna 102 may be an antenna element which cooperate to form an antenna.

FIG. 1B illustrates a distributed phased array capable of being utilized for wireless power transfer and/or digital communication in accordance with an embodiment of the invention. Phased antenna sub-arrays 104 may be positioned throughout an indoor setting. These phased antenna sub-arrays 104 may be synchronized using OTS via optical fiber 106. In some embodiments, the phased antenna sub-arrays 104 may be synchronized through free space using a radiated laser beam.

FIG. 1C illustrates an example very large scale phased array with complete or partial (e.g. between remote domains) optical synchronization across the array in accordance with an embodiment of the invention. Many embodiments of the invention include a complete and functional optically synchronized phased array in CMOS, with an on-chip integrated bulk CMOS photodiode. Optically synchronized phased arrays in CMOS may be low-cost, commercially viable method of distribution of clock signals over long distances. Some embodiments include hybrid solutions, where a long-distance optical reference 110 is distributed optically, with local electrical timing 108 distribution, as illustrated in FIG. 1C. The local electrical timing 108 is configured to distribute timing to multiple antenna arrays 112. The local electrical timing 108 may use the long-distance optical reference 110 to generate an electronic clock signal which may be used to synchronize the multiple antenna arrays 112.

Reference Distribution Methods

As discussed above one method for distributing timing information within a phased array is through an electronic clock reference which may be distributed to the elements of an array. FIG. 2A illustrates an example of a low frequency timing synchronization (LFTS) system using a digital clock signal. The LFTS system may treat the distribution lines as capacitive loads. As the array size increases, the lines may be buffered in order maintain the signal integrity. This method may be cost-effective and power-efficient but the addition of buffers adds jitter and PVT-dependent which may skew the clock signal. Relatively low LFTS frequency benefits from high multiplication ratios in the local frequency synthesizers on the element side, which may further limit the overall system performance.

Figure 2B:
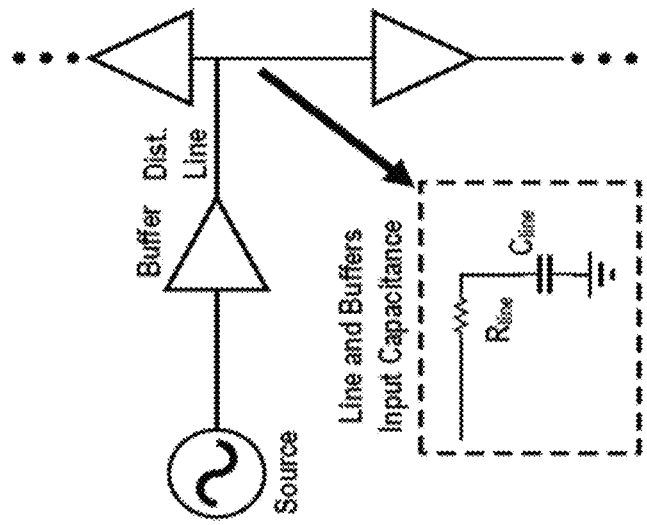
FIG. 2B conceptually illustrates a radio frequency timing synchronization (RFTS) system.
Figure 2A:
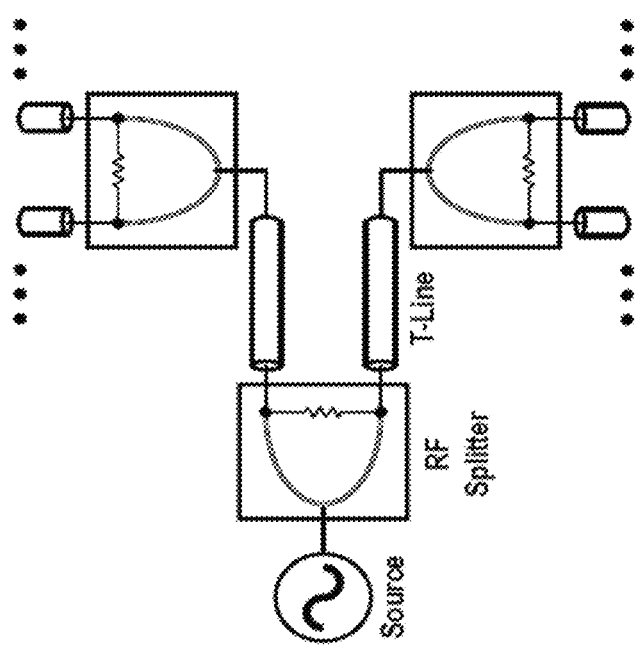
FIG. 2A conceptually illustrates a system for performing low frequency timing synchronization (LFTS) using a digital clock signal.

FIG. 2B illustrates an example of a radio frequency timing synchronization (RFTS) system which may alleviate the disadvantages in noise and functionality present in an LFTS system. A RFTS system distributes a clock, usually in the GHz range, along impedance-matched transmission lines. Consequently, the signal amplitude may deteriorate due to the loss in the lines and in the signal splitters. This architecture may enable the use of low-multiplier local synthesizers, so the reference noise may be mainly determined by the input signal to noise ratio (SNR) and the noise figure of the element's driver. The trade-off between the clock source power and reference noise may allow a RFTS system to achieve superior performance when compared to a LFTS system at the expense of an increased power dissipation. Despite its advantages, a RFTS system does not scale well and may be mostly used in specialty noncommercial applications, due to the cost of high-performance RF materials.

Figure 2C:
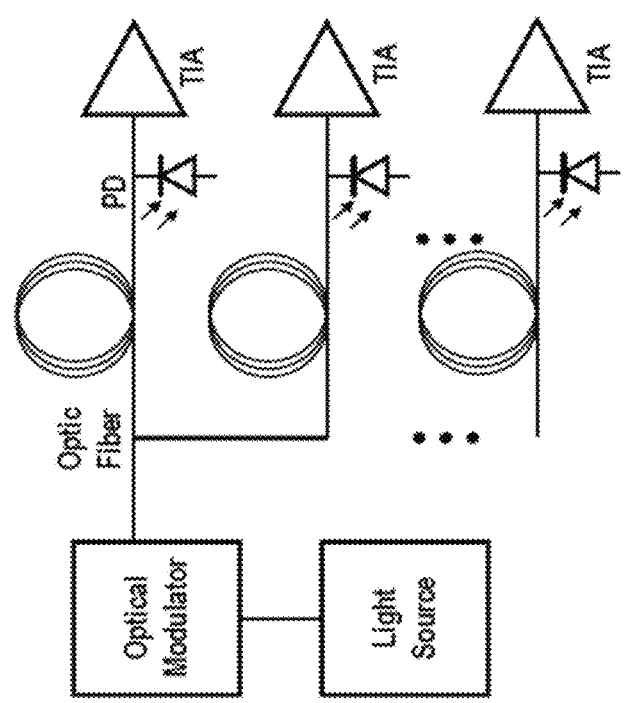
FIG. 2C conceptually illustrates a system for performing optical timing synchronization (OTS) over fiber in accordance with an embodiment of the invention.

FIG. 2C illustrates a system utilizing OTS over fiber or other optical channels in accordance with an embodiment of the invention. OTS over fiber or other optical channels may be used to distribute timing information in arrays. This enables scaling beyond the array (or multiple arrays as in FIGS. 1A-1C) sizes addressable by LFTS without the potential weight, cost and loss penalties associated with RFTS as illustrated in Table I. Table I compares the performance of common RF materials to optical fibers, and shows that optical infrastructure provides more than an order of magnitude of improvement in the cost, line loss, and mass of the synchronization network.

TABLE I

| Material | Mass density | Loss | Example Cost |
|---|---|---|---|
| RG58 coax | 170 g/m | 2.3 dB/m | ~$15/m |
| 20 mil RO4350B | 1.83 g/cm$^3$ | 6.3 dB/m | ~$30/cm |
| 60 mil FR-4 | ~2 g/cm$^3$ | 25 dB/m | ~$0.1/cm |
| SMF-28 jacketed | 17.4 g/m | 0.5 dB/km | ~$3/m |
| SMF-28 bare | 2.9 g/m | 0.5 dB/km | ~$3/m |

The SMF-28 jacketed and bare are optical fibers whereas the remainder of the materials represent electrical cabling. As illustrated, the optical fibers have improved mass density, loss, and costs. In some embodiments, the phased antenna sub-arrays may be synchronized through free space using a radiated laser beam which may save on the use of transmissive materials.

Figure 3A:
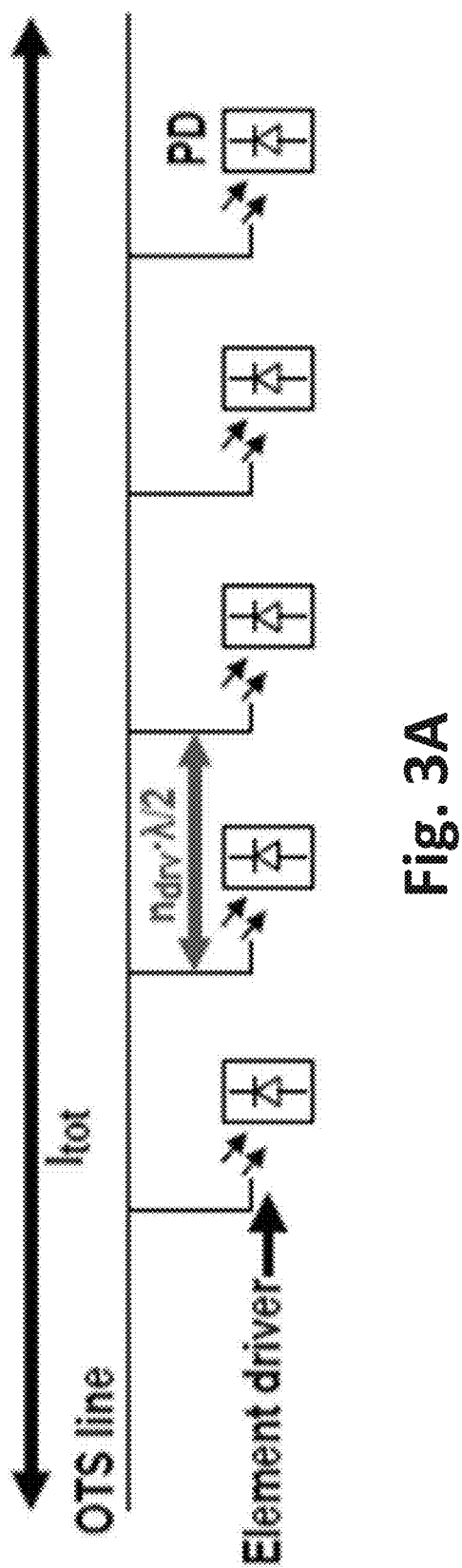
FIG. 3A illustrates an implementation of an OTS clock distribution system in accordance with an embodiment of the invention.
Figure 3B:
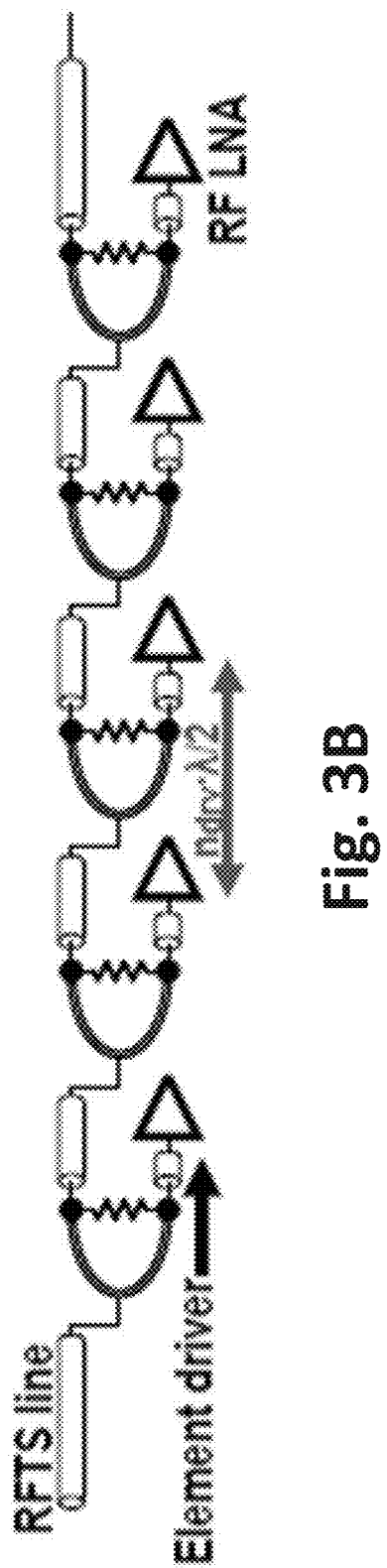
FIG. 3B conceptually illustrates operation of an RFTS clock distribution system.

FIG. 3A illustrates an implementation of an OTS clock distribution system in accordance with an embodiment of the invention. For comparison, FIG. 3B illustrates an example of a RFTS clock distribution system. FIG. 3C illustrates an example of an LFTS clock distribution system. Illustrated below is a quantitative comparison of a system utilizing OTS with electrical synchronization in terms of power and noise performance for 1-D arrays with a length $l_{tot}$ with a RFTS system and a LFTS system. In some embodiments, sparse arrays may include a single element at the end of the distribution line. In some embodiments, dense arrays may include amplifiers along the array drive $n_{drv}$ radiators separated $\lambda/2$ apart.

Comparison between OTS and RFTS

In a RFTS system, the reference may be directly distributed through electrical lines, while in a system utilizing OTS, an optical carrier may be modulated with an RF reference. Due to the substantially different carrier frequencies, propagation media, and modes, the loss mechanisms of the two methods may be fundamentally different. In a RFTS system, the main contributors to the exponentially increasing network loss may be the metal conductor losses and non-ideal signal splitters. A system utilizing OTS on the other hand, may provide practically negligible the network losses compared to the photodiode (PD) conversion efficiency. Beyond a certain array size, the weak distance-dependent loss of OTS may be favorable over RFTS. Below, the power that may be used to provide a predetermined integrated phase noise at the output of the chip front-end amplifier is calculated.

The normalized noise floor, or phase noise power spectral density (PSD) $\phi_{psd}^2$, of a driven amplifier with a noise factor F at a temperature T is related to amplifier input power $P_{chip}$ by:

$$\phi_{psd}^2 = F \cdot \frac{kT}{P_{chip}} \tag{1}$$

The chip input power is simply the clock source power $P_{src}$, scaled by its efficiency $\eta_{src}$ and attenuated by the network insertion loss $L_{nw}$ $$P_{chip} = P_{src} \cdot \eta_{src} \cdot L_{nw} \tag{2}$$

The integrated phase error $\phi_{rms}$ depends on the amplifier bandwidth B and is approximately $$\phi_{rms} \approx \sqrt{B \cdot \phi_{psd}^2} \tag{3}$$

For a given clock frequency $f_{ck}$, the phase error can be converted to a timing error $t_{rms}$ so the clock source power can be rewritten as $$P_{src} = \frac{kTFB}{(2\pi f_{ck} t_{rms})^2} \cdot \frac{1}{L_{nw}\eta_{src}} \tag{4}$$

In some embodiments, a system utilizing an OTS scheme may employs a PD with an efficiency of $\eta_{pd}$ in addition to a front-end receiver. For typical distances, the line loss may be negligible compared to the PD loss, so an OTS line driving M chips may have a power dissipation of $$P_{ots} = M \cdot \frac{P_{chip}}{\eta_{pd}\eta_{src}} \tag{5}$$

In comparison, a RFTS system may include the use of power splitters and lines to distribute its clock signal. The insertion loss $L_{rf}$ of a transmission line with a length of $\eta_{drv} \cdot \lambda/2$ and a loss of a dB/m, followed by a single splitter with a loss of $\alpha_{spl}$ dB which can be expressed as $$L_{rf} = 10^{-(\alpha \cdot n_{drv} \cdot \frac{\lambda}{2} + \alpha_{spl})/20} \tag{6}$$

A 1-D RFTS network that drives M ICs may dissipate $$P_{rfts} = \frac{P_{chip}}{\eta_{src}} \cdot \sum_{m=1}^{M} \left(\frac{1}{L_{rf}}\right)^m \tag{7}$$

in order to comply with the required integrated phase noise. This may be a geometric series with a sum of $$P_{rfts} = \frac{P_{chip}}{L_{rf} \cdot \eta_{src}} \cdot \frac{1 - L_{rf}^{-M}}{1 - L_{rf}^{-1}} \tag{8}$$

Figure 4B:
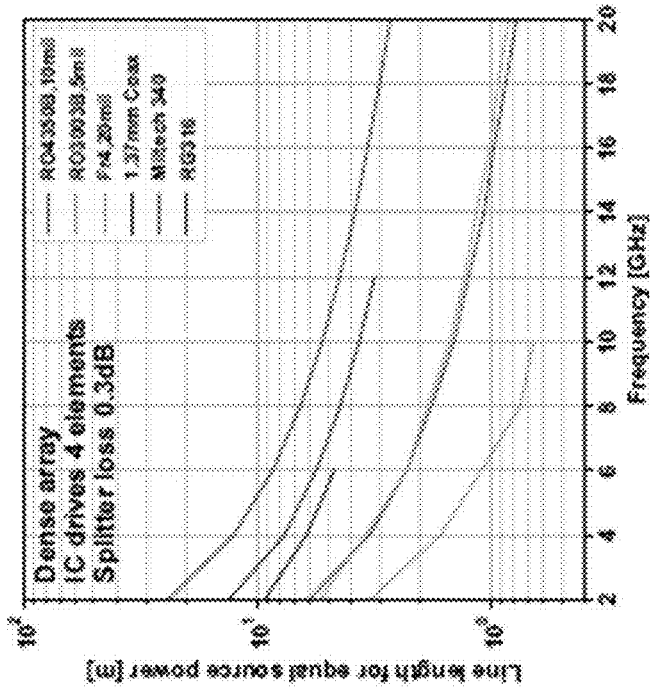
FIG. 4B illustrates power dissipation for a dense array.
Figure 4A:
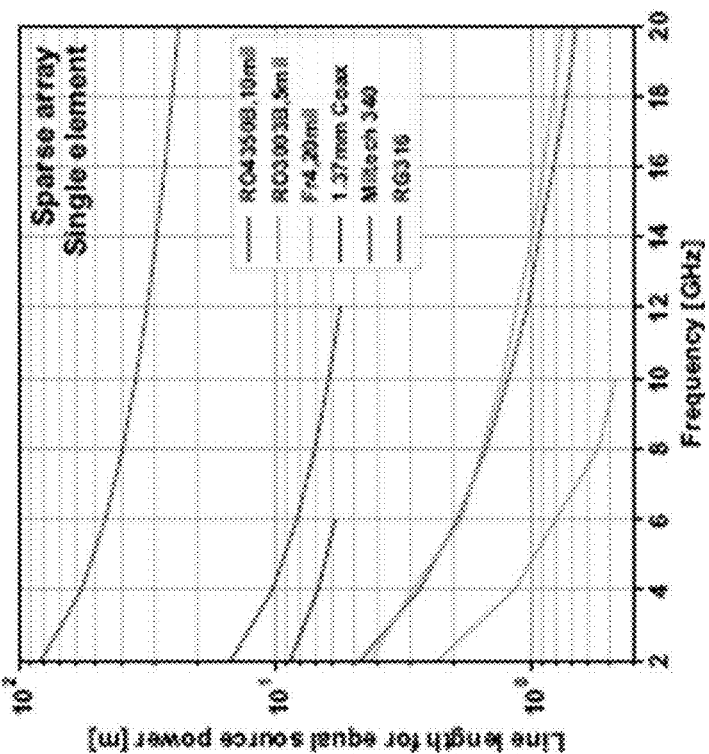
FIG. 4A illustrates power dissipation for a sparse array.

FIGS. 4A and 4B illustrates a comparison between $P_{rfts}$ in several common RF materials and $P_{ots}$ to find the array size (span) beyond which a system utilizing OTS is favorable from a power dissipation perspective, for the same integrated noise performance. As illustrated, array span above which RFTS power dissipation exceeds OTS power dissipation. FIG. 4A illustrates an example power dissipation for a sparse array with one element at its end. FIG. 4B illustrates an example power dissipation for a dense array. For each of these, a similar front-end amplifier was used for both distribution methods. For a system utilizing OTS, a 20% efficient photodiode was used. For a RFTS system, a modest RF splitter loss of 0.3 dB was used. Also, the RF and optical source efficiencies were between 50% and 30%, respectively, with similar reference and RF output frequencies.

As illustrated in FIG. 4A, in sparse arrays with a reference frequency above 10 GHz, a system utilizing OTS may be favorable for lines longer than 1 m when compared to a PCB-based RFTS system, and 6 m when compared to coaxial lines. One exception is specialty RF lines with exceptionally low loss. Those, however, are about two orders of magnitude heavier and more expensive than optical fibers. FIG. 4B illustrates that a system utilizing OTS is favorable at similar scales to sparse arrays, since the addition of PDs to the array benefits from linearly increasing laser source power, while increasing the line's length increases the required RF source power exponentially. For high-performance RF materials in particular, the cascaded losses of RF power splitters may dominate the infrastructure performance.

Comparison Between OTS and LFTS

Figure 5:
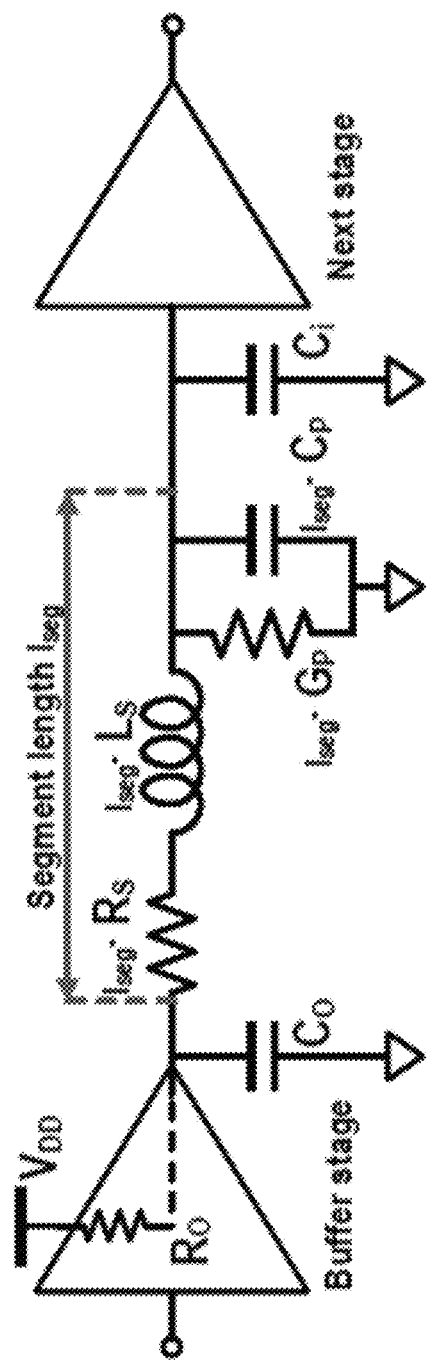
FIG. 5 conceptually illustrates an LFTS network segment.

LFTS frequencies may be typically lower than those used for RFTS. As illustrated in FIG. 3C, the design divides the distribution line into segments which are often significantly shorter electrically than the reference wavelength. FIG. 5 illustrates an example LFTS network segment model. Each segment may include lumped elements for LFTS. The element driver spacing depends on $n_{drv}$ and may be generally independent of the line buffer spacing $I_{seg}$. The maximum LFTS clock frequency $f_{lfts}$ may be limited to approximately the resonance frequency associated with the line segment parasitic elements. $f_{lfts}$ may be expressed in terms of the segment length $I_{seg}$, as well as $C_P$ and $L_S$, the parallel capacitance and series inductance per unit length, as $$f_{lfts} < \frac{1}{2\pi \cdot l_{seg} \cdot \sqrt{C_P L_S}} \quad (9)$$

The width of each segment may be chosen so its resistive and dielectric losses $R_S$ and $G_P$ are negligible, and its length may be made short enough for it to be treated as a lumped capacitor. Then the LFTS clock power dissipation of a line of length $I_{tot}$ may be computed through $$P_{lfts} \approx f_{lfts} \cdot I_{tot} \cdot C_P V^2 \quad (10)$$

where V is the buffer supply voltage.

Figure 6B:
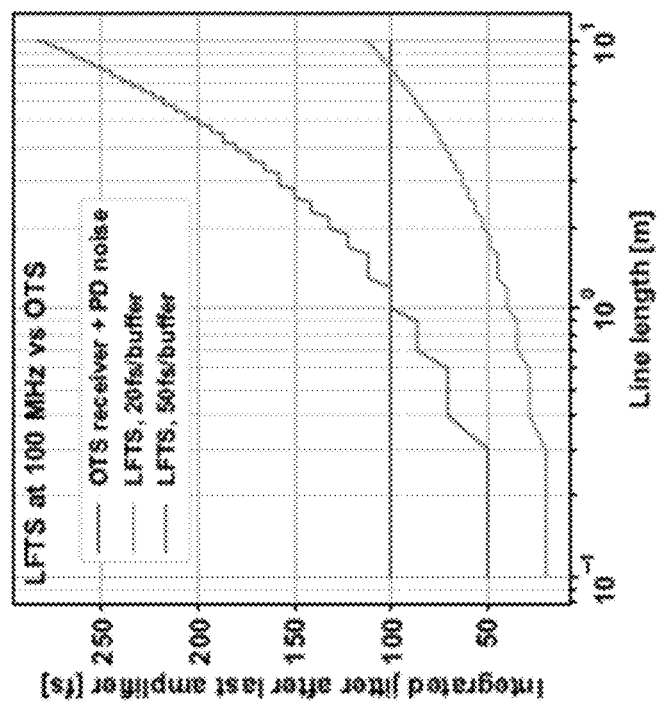
FIG. 6B illustrates a comparison of noise in a phased array when OTS is utilized and when LFTS is utilized.
Figure 6A:
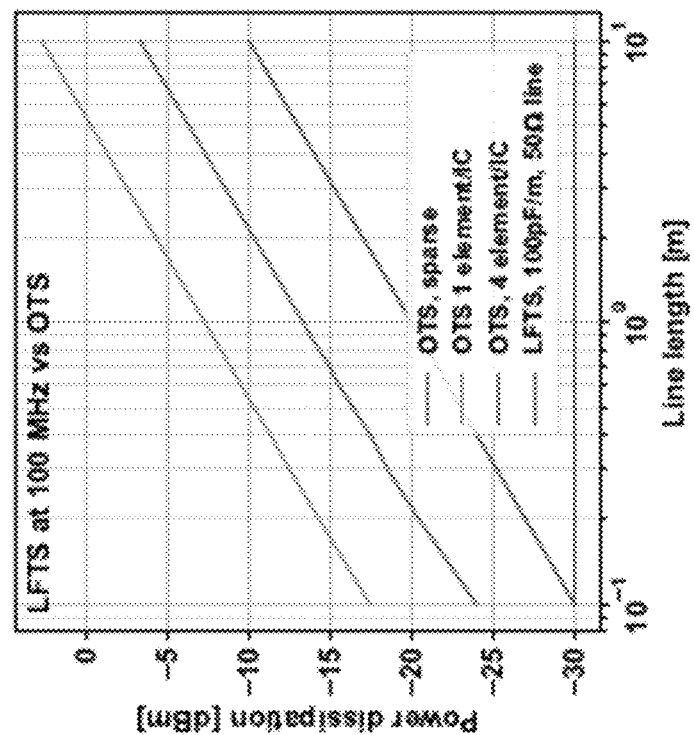
FIG. 6A illustrate a comparison of power dissipation when OTS is utilized within a phased array and when LFTS is utilized within a phased array.

FIGS. 6A and 6B illustrate a comparison of a system utilizing OTS and LFTS. FIG. 6A illustrates a comparison of power dissipation whereas FIG. 6B illustrates a noise comparison. FIG. 6A compares the power dissipations of a system utilizing LFTS at 100 MHz and OTS. A capacitance per unit length of 100 pF/m may be approximately exhibited by most PCB and coaxial materials for a 50 characteristic impedance. In some embodiments, a system utilizing OTS may be far superior than LFTS for sparse arrays due to the length-independent power dissipation. However, in a system utilizing OTS, power dissipation scales with the number of PDs, so this advantage may diminish as the array becomes more dense. For a noise performance comparison $n_{buf}$ may be estimated. $n_{buf}$ may be the required number of LFTS line buffers which cascade and add jitter to the system.

$$n_{buf} > \lceil l_{tot} \cdot 2\pi \cdot f_{LFTS} \cdot \sqrt{C_P L_S} \rceil \quad (11)$$

Segment lengths may be comparable to the clock electrical wavelength, even though they may actually be much shorter in order to be regarded as capacitive loads. This may be done to avoid ruling out resonant lumped-model designs, despite the fact that they are prone to phase drifts, do not generally scale well in size for high-Q line resonators, and are not commonly used. Consideration of such long segments may result in an overly optimistic jitter prediction for a LFTS system. The cascaded noise at the end of the distribution line may be $$N_{max} = N_{buf} \sqrt{n_{buf}} \quad (12)$$

assuming that each buffer has a noise of Nbuf and that the buffer noise sources are independent from each other. FIG. 6B illustrates how the LFTS-only approach presents growing noise performance challenges if used to synchronize large and/or distant array domains.

In some embodiments, a system utilizing OTS may be a good complement to LFTS as a standalone solution or in a hybrid scheme. In some embodiments, a hybrid scheme may include using a long distance optical clock and a local electrical timing reference. In some embodiments, a system utilizing OTS functionality may be implemented into a single phased array transmitter radio frequency integrated circuit (RFIC), fabricated in a low-cost bulk CMOS process. The RFIC may enable the benefits of OTS in size-constrained indoor applications and in the cost-driven consumer market.

Embodiments Including RFIC Including OTS

Figure 7:
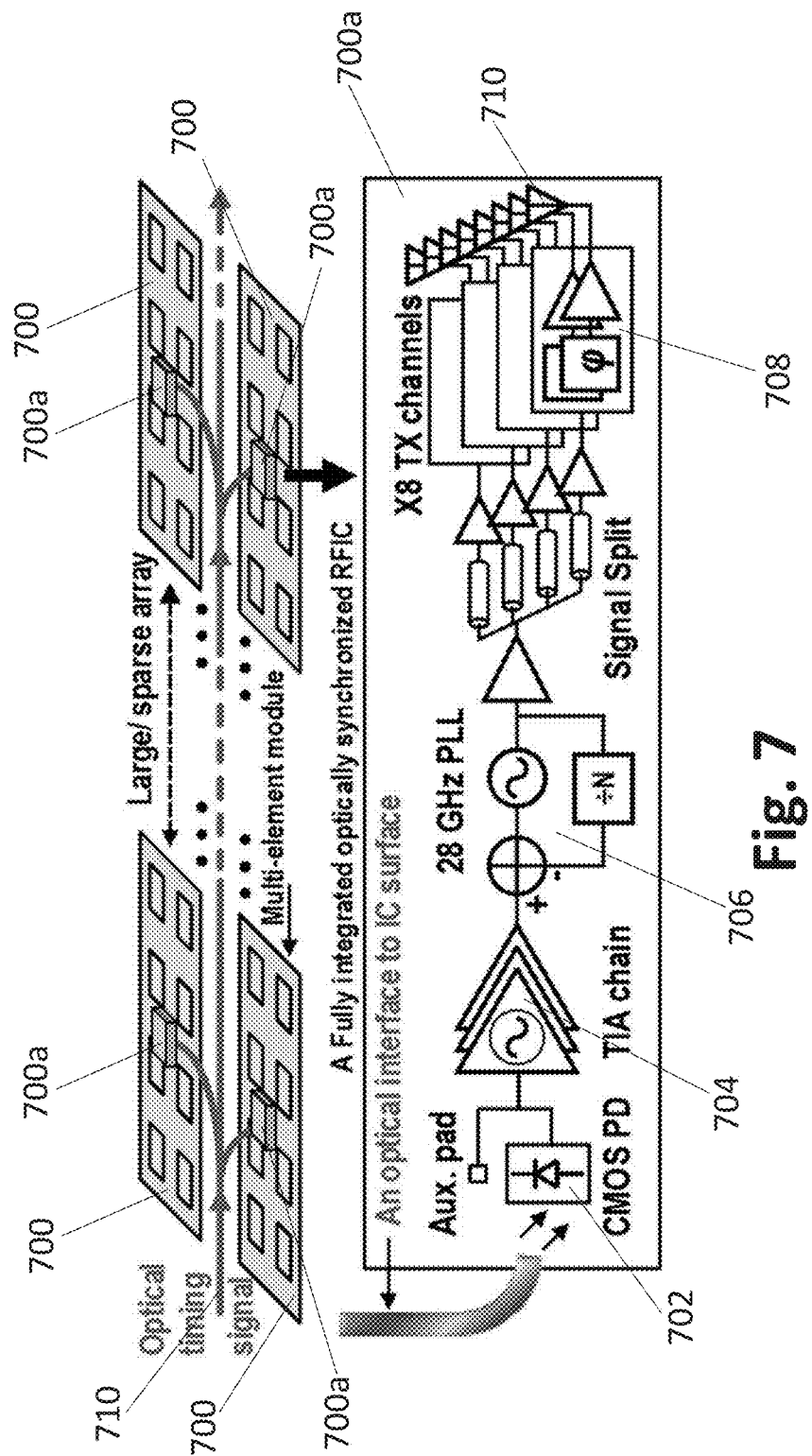
FIG. 7 conceptually illustrates an OTS phased array transmitter system in accordance with an embodiment of the invention.

FIG. 7 illustrates an example OTS phased array transmitter system architecture in accordance with an embodiment of the invention. OTS system may include multiple RF modules 700 which may each include a CMOS RFIC 700a. In some embodiments, there may be eight RF modules 700 with RF output in the 28 GHz frequency range, synchronized to an optical reference at 7 GHz. Each of these CMOS RFIC 700a may receive a shared optical timing signal 710. This may enable the construction of large and/or sparse arrays that can span long distances.

The RFIC 700a may include multiple functional sections. A front-end (FE) receiver may include a CMOS integrated photodiode (PD) 702 and an injection-locked transimpedance amplifier (TIA) chain 704. The CMOS integrated PD 702 may operate near the visible wavelength range. The CMOS integrated PD 702 may receive the shared optical timing signal 710 which may be used to synchronize each RF module 700. The TIA chain 704 may amplify the optical signal to 1V supply digital levels. A digital clock signal may be fed into a low-noise fully integrated synthesizer phase-locked loop (PLL) 706. The PLL 706 may have a low multiplication ratio to generate and distribute the desired output RF frequency. Lastly, the signal may be buffered and distributed to drive eight TX channels 708 with independently controlled phase amplitude. The TX channels 708 may perform beamforming and data transfer. The TX channels 708 may transfer their signal through antennas 710.

Embodiments Including Modular Phased Array Building Block

Figure 8A:
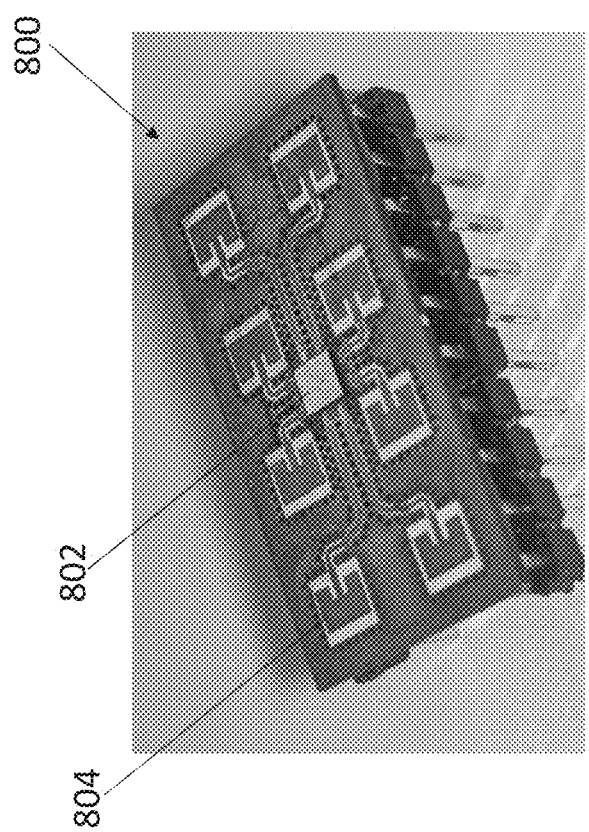
FIG. 8A illustrates a fabricated phase array block as a fully assembled PCB in accordance with an embodiment of the invention.

FIG. 8A illustrates a fabricated phase array block as a fully assembled PCB 800 in accordance with an embodiment of the invention. The PCB 800 may include an RFIC chip 802 which may implement the CMOS RFIC 702 as described and illustrated in FIG. 7. The RFIC chip 802 may be electrically connected to antennas 804 which may correspond to the antennas 710 described in connection with FIG. 7. The RFIC chip 802 may be used to output a signal through the antennas 804.

Figure 8B:
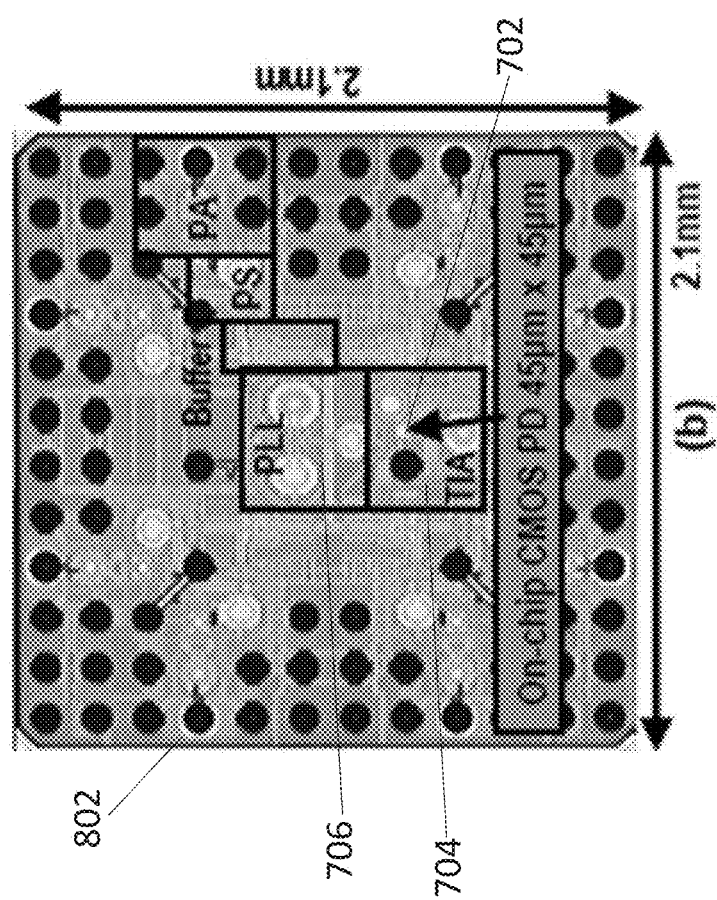
FIG. 8B illustrates a die photo of an example fabricated RFIC chip in accordance with an embodiment of the invention.

FIG. 8B illustrates a die photo of an example fabricated RFIC chip 802 in accordance with an embodiment of the invention. The RFIC chip 802 may be a single integrated circuit (IC) including the components described in connection with FIG. 7. The overlapping descriptions of FIG. 7 will be applicable to FIGS. 8A-8C and those descriptions will not be repeated.

Figure 8C:
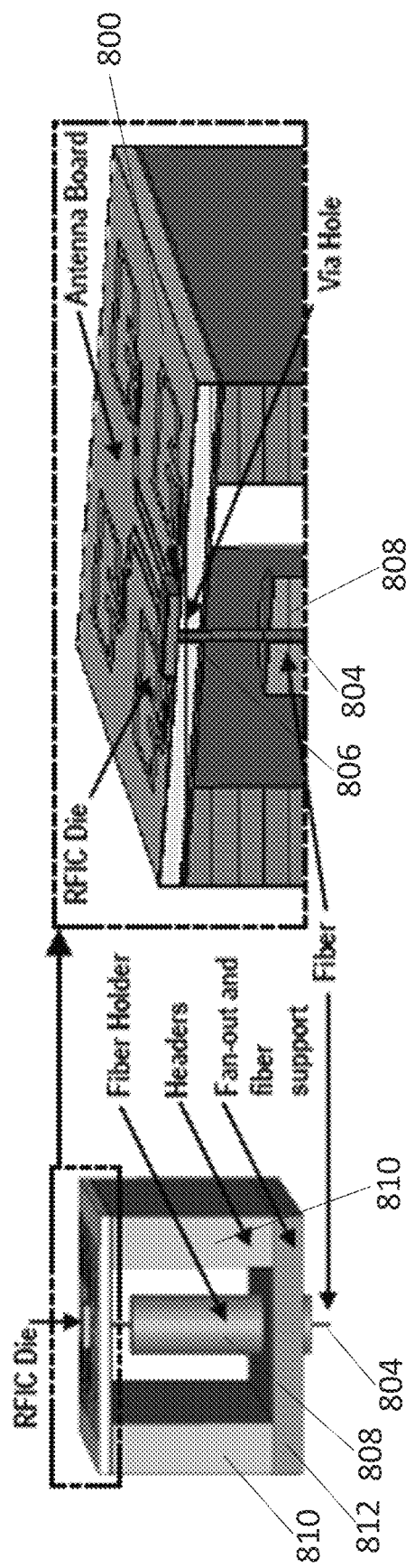
FIG. 8C illustrates a structure of a fiber mount in accordance with an embodiment of the invention.

FIG. 8C illustrates a structure of a fiber mount in accordance with an embodiment of the invention. The RFIC chip 802 may be flip-chip bonded to a modular PCB 800 with multiple antennas 804. The multiple antennas 804 may be eight antennas. The antennas 804 may be separated by 0.6λ apart. The antennas 804 may be 28 GHz transmit patch antennas. The module size of the modular PCB 800 may be 1.2λ×2.4λ to allow uniform tiling of the modular PCB 800 to a larger array. FIG. 8C illustrates the interface between the optical signal and the chip surface. An optical fiber 804 may be inserted through a via hole 806 in the PCB 800 that is aligned with the on-chip PD 702 on the RFIC chip 802 and fixed to a rigid support 808. The optical fiber may be 125 µm thick. Headers 810 and a bottom board 812 that hold the fiber support 808 may be also used to distribute power and communication signals to other array sub-modules.

While FIGS. 8A-8C illustrate an embodiment where the optical timing signal is shared through optical fiber, a skilled artisan would appreciate that the phased antenna sub-arrays may also be synchronized through free space using a radiated laser beam.

Examples of PD

Figure 9:
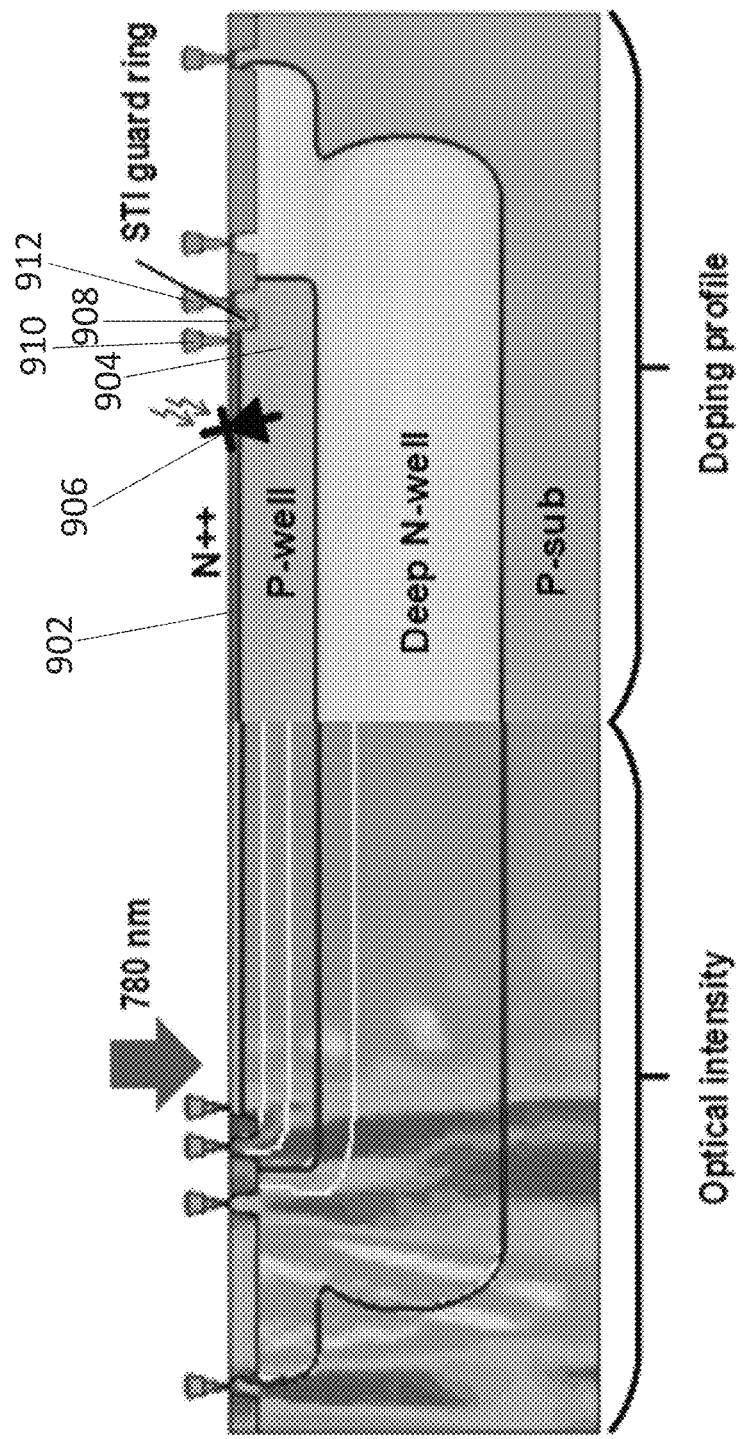
FIG. 9 illustrates a schematic for a photodiode design in accordance with an embodiment of the invention.

FIG. 9 illustrates an example of a schematic for a photodiode design in accordance with an embodiment of the invention. The photodiode design includes an N++ region 902 and P+ region 904 which make up the N++/P+ junction 906. A shallow trench (ST) isolation 908 may isolate the N++ contact 910 from the P+ contact 912.

FIG. 10A illustrates an example CMOS photodiode responsivity, measured at 780 nm with about −25 dBm input power. The fluctuations may reflect the intensity noise of the source laser. The responsivity is shown in FIG. 10A and was measured at 780 nm, which is the optical wavelength that is intensity modulated by the reference. FIG. 10B illustrates photo diode tank noise output assuming an infinite extinction ratio, $P_{in}=9$ dBm, $r_s=2$, and Q=10. The dashed lines show the $\phi_{pd}^2$ for 100 fs and 20 fs jitter. In some embodiments, full integration of photo diodes in bulk CMOS may provide a direct optical interface to a standard electronic chip. Due to the high frequency nature of the timing signal, it may be inefficient to transfer the optical timing signal from the photo diodes to the rest of the circuit. Thus, it may be advantageous to include the photo diode on the bulk CMOS to have a single chip which performs the functionality of receiving the optical timing signal and sending the signal through the antennas. In some embodiments, the photo diode may be connected to the rest of the circuit through one or more waveguides. As illustrated in FIG. 9, the integrated photodiode may include a three finger, n++/p-well diode with shallow-trench isolation (STI) guard rings and a deep n-well diffusion current block. In some embodiments, in the case of single-tone reference distribution, the PD capacitance may be resonated with an inductor, which also may provide DC biasing to the cathode of the PD. Description of these embodiments is further presented in the description of FIGS. 11A and 11B.

Considering just the photodiode and the resonant tank, the two main sources of noise may be thermal noise and shot noise. The thermal noise may be dominated by the integrated inductor, which may have a Q≈10. However, at bias voltages close to breakdown, the shot noise may be significantly greater than the thermal noise as illustrated in FIG. 10B.

To analyze the shot noise, the McIntyre model may overestimate avalanche noise in a CMOS avalanche photodiode (APD). Nevertheless, the McIntyre model may be a simple way to estimate the upper bound of shot noise generated by the APD. In some embodiments, keff may be calculated numerically. The parameter keff may be used together with the avalanche gain to determine the excess noise factor, given by:

$$F = k_{eff}M + (1 - k_{eff})\left(2 - \frac{1}{M}\right) \quad (13)$$

Inductor parallel resistance may be approximately $Q^2 \cdot r_s$, where $r_s$ may be the series resistance and Q may be the quality factor of the inductor. Then, omitting the photodiode dark current, the phase noise can be expressed as $$Q_{pd}^2 = 10\log\left[\frac{2qM^2 FR_0 P_{in} + 4kT/Q^2 r_s}{(MR_0 P_{in})^2}\right] \quad (14)$$

where M is the avalanche gain, $R_0$ is the zero bias responsivity, and k is Boltzmann's constant. Using the plot in FIG. 10B, the reverse bias to achieve a particular jitter specification at the input to the front-end amplifier may be determined.

Examples of the Front-End Amplifier

Figure 11A:
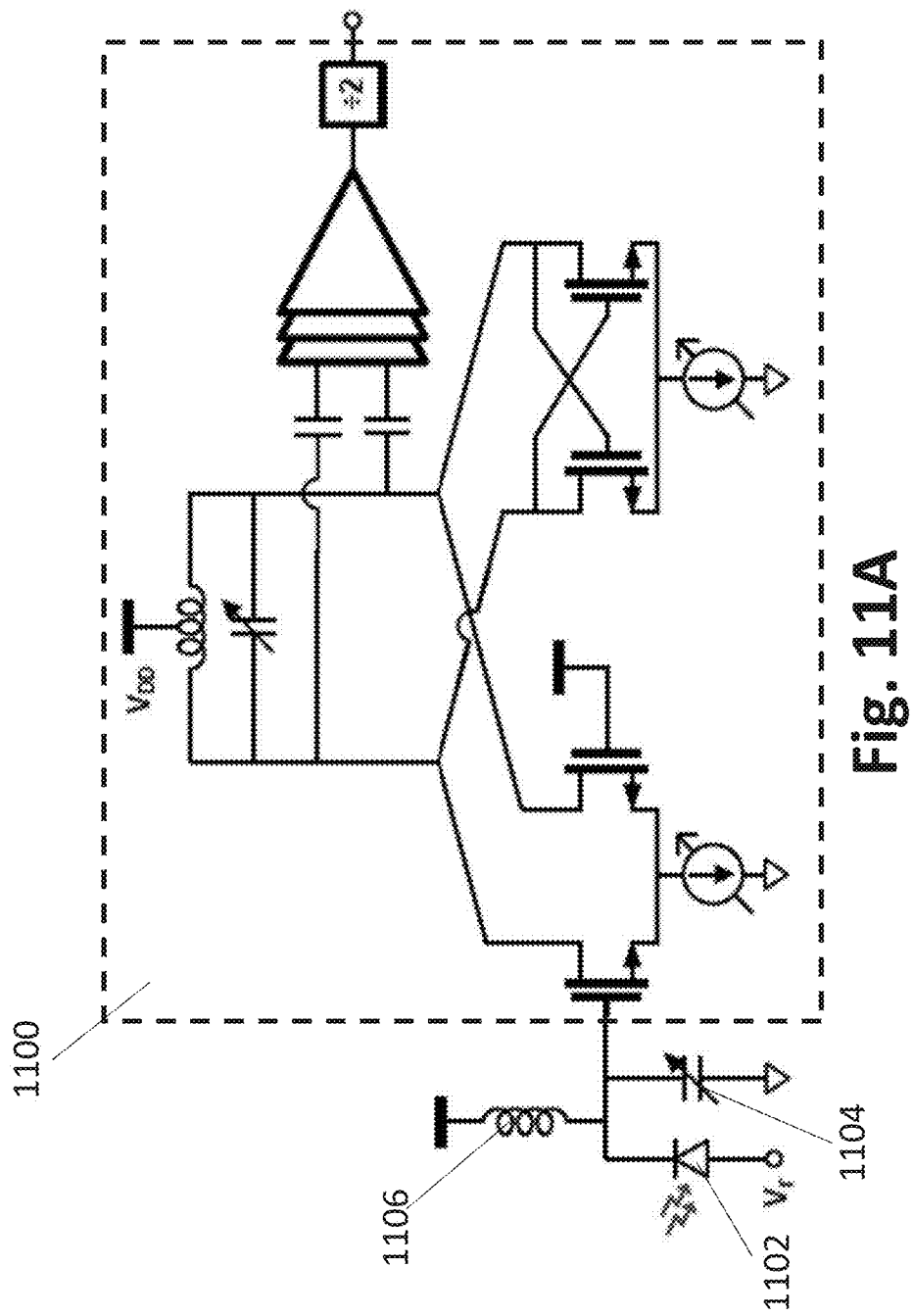
FIG. 11A illustrates a schematic of a receiver tuned injection locked transimpedance amplifier (TIL-TIA) capable of receiving an optical synchronization signal in accordance with an embodiment of the invention.
Figure 11B:
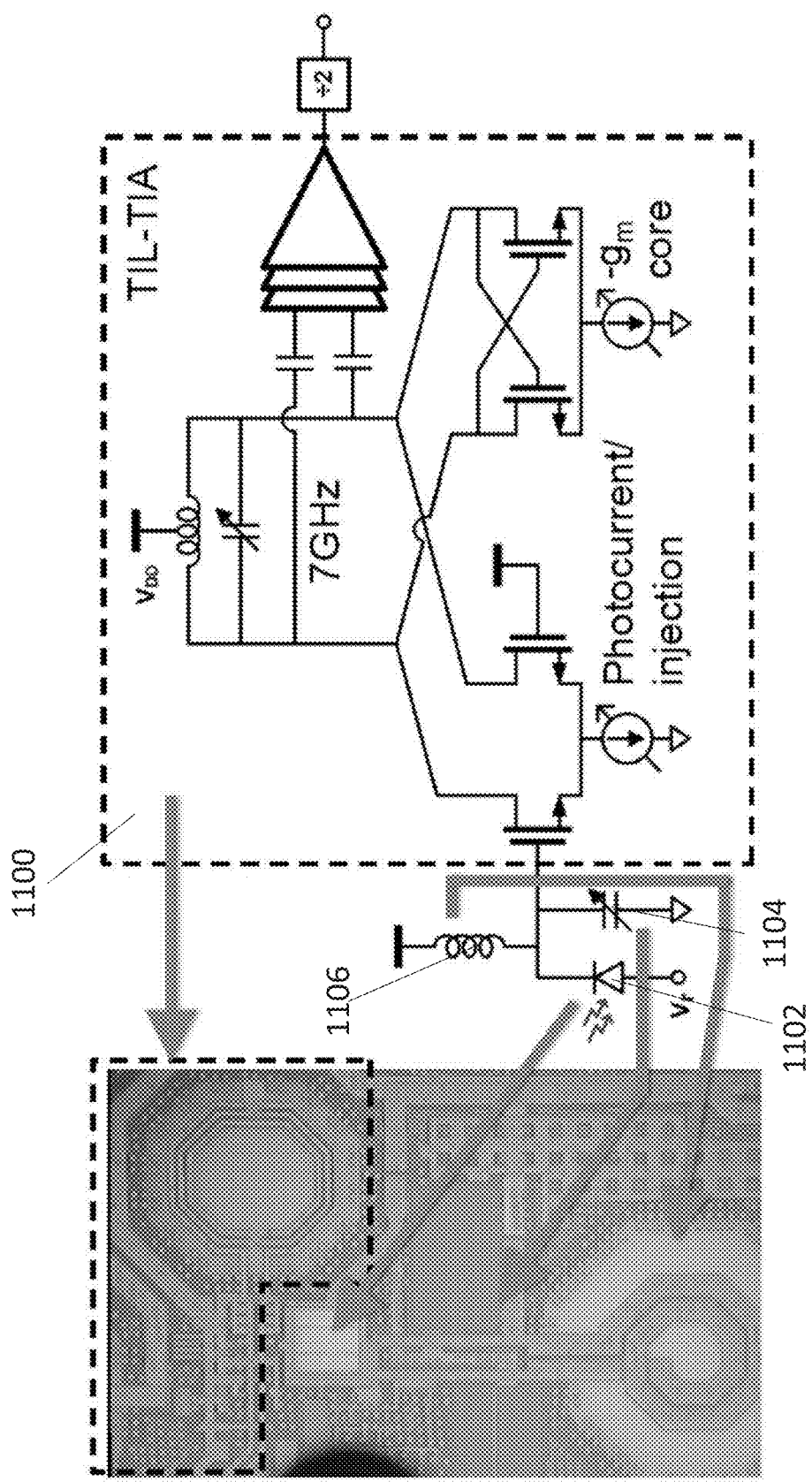
FIG. 11B illustrates the correspondence between the schematic of FIG. 11A and a closeup image of the RFIC chip layout of FIG. 8B.

FIG. 11A illustrates a schematic of a receiver tuned injection locked transimpedance amplifier (TIL-TIA) in accordance with an embodiment of the invention. The receiver TIA can be configured either as a driven LNA as specified in (1)-(5), or as a tuned injection-locked TIA (TIL-TIA), to boost the FE sensitivity at the expense of a limited lock range. FIG. 11B illustrates the correspondence with the schematic of FIG. 11A with a closeup image of the RFIC chip layout of FIG. 8B. As illustrated, the TIL-TIA 1100 may be connected to a PD 1102. The PD 1102 anode may be connected to a reverse bias pin, Vr, which can be set independently to a desired reverse bias (e.g. as low as −9.5 V before breakdown occurs). The TIL-TIA 1100 may also be connected to a capacitor 1104 and an inductor 1106. Advantageously, the capacitor 1104 and the inductor 1106 may work together to produce an injection locked amplifier which may only implement tuned oscillation frequencies. The capacitor 1104 and the inductor 1106 may allow a narrow frequency range to pass through and increase ability of the PD 1102 to drive the current at the resonance frequency.

Without limitation to any particular theory, the photocurrent may go through the inductor 1106 and the capacitor 1104 where they only allow a very narrow frequency range to pass through. The capacitor 1104 and the inductor 1106 create a circuit that establishes resonant behavior in which energy oscillates between storage in the inductor and storage in the capacitor. If there was only the inductor 1106 or the capacitor 1104 present, a resonant behavior may not occur and/or energy would be dissipated by a resistive component. Referring again to the illustrated embodiment, resistance remains relatively constant as frequency increases, but the impedance of the capacitor 1104 decreases. This may filter noise that comes out of the PD 1102. Also, this may increase the ability of the PD 1102 to drive current at the resonant frequency of the circuit. The PD 1102 may have a parasitic capacitance. When combined with just the capacitor 1104, the PD 1102 may use a considerable amount of power charging and discharging the capacitor 1104. By including the inductor 1106 as well, more of the photocurrent generated by the PD 1102 is provided to the TIL-TIA 1100.

The reference may be further divided by 2 to 3.5 GHz, which may ease on-chip signal distribution and may reduce the coupling to the first tuned-amplifier. The combined TIL-TIA and divider together may nominally draw 9 mA from a 1V supply.

In some embodiments, the injection-locked amplifier may be included with a subsequent PLL. The phase noise of the TIL-TIA 1100 may be the short-term random phase deviation of its output compared to the phase of the injected signal. It can be shown that an injection locked oscillator shapes the noise of the injected signal $\mathcal{L}_i(\Delta\omega)$ and the free-running oscillation $\mathcal{L}_f(\Delta\omega)$ similarly to a first-order PLL. The TIL-TIA 1100 may be used to amplify a weak injection signal, so in that case its output phase noise may be $$\mathcal{L}_{tiltia}(\Delta\omega) \approx \frac{\Delta\omega^2}{\Delta\omega^2 + (\omega_L^2 - \Delta\omega_0^2)} \mathcal{L}_f(\Delta\omega) + \frac{(\omega_L^2 - \Delta\omega_0^2)}{\Delta\omega^2 + (\omega_L^2 - \Delta\omega_0^2)} \mathcal{L}_i(\Delta\omega) \quad (15)$$

where $\omega_L$ is the TIL-TIA lock range, and $\Delta\omega_0$ is the difference between the injection frequency and the TIL-TIA free-running frequency. In (15), an interchangeable effect of increasing the lock range and injecting a signal closer to the TIL-TIA center-frequency on the noise loop-bandwidth is present.

FIG. 12A illustrates an example TIL-TIA noise output under injection with SNR floor of −128 dBC. FIG. 12B illustrates TIL-TIA noise output combined VCO and source noise as a function of TIL-TIA loop bandwidth. FIG. 12A shows how the TIL-TIA feedback loop shapes its output noise while FIG. 12B illustrates how modifying the loop bandwidth affects the output noise. The phase noise curve of a typical CMOS LC oscillator, and a signal source with an SNR floor of −128 dBc/Hz at 7 GHz, corresponding to a jitter of 100 fs when integrated over a 50 MHz SSB bandwidth may be used. Optimum noise performance may be achieved for a loop-bandwidth chosen roughly at the intersection of the reference and the freerunning oscillator noise curves. However, this bandwidth may depend on the injection strength. This constraint may be alleviated, however, by the subsequent on-chip synthesizer which may further limit the TIL-TIA noise bandwidth.

Figure 13B:
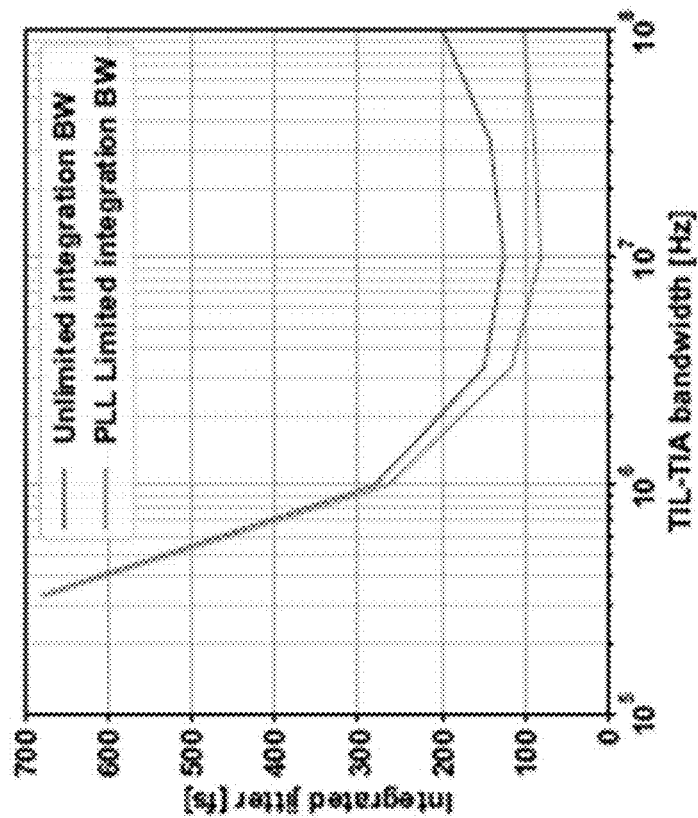
FIG. 13B illustrates noise output of the effect of limiting the noise bandwidth on lock-range (TIL-TIA bandwidth) sensitivity.
Figure 13A:
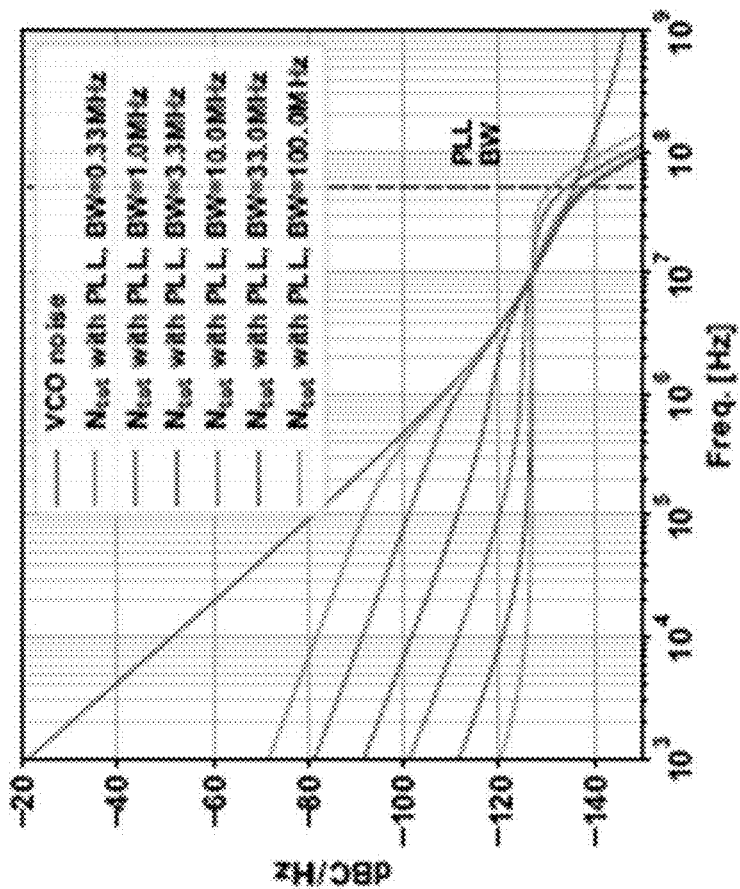
FIG. 13A illustrates noise output of a bandwidth limited TIL-TIA.

FIG. 13A illustrates an example noise output of a bandwidth limited TIL-TIA. FIG. 13B illustrates an example noise output of the effect of limiting the noise bandwidth on lock-range (TIL-TIA bandwidth) sensitivity. In FIG. 13A, an additional second order low-pass filter of the form $$\mathcal{L}(\Delta\omega)_{pll} = \frac{\omega_{pll}^2}{\omega_{pll}^2 + 2\xi\omega_{pll}s + s^2} \mathcal{L}(\Delta\omega)_{tiltia} \quad (16)$$

shapes the TIL-TIA output noise. FIG. 13B illustrates how the limited subsequent PLL bandwidth may significantly relax the requirement for accurate injection strength control; as long as the injection strength is beyond a certain threshold, it should not limit the overall system noise performance.

FIG. 14A illustrates an example measured TIL-TIA noise output under variable injection strength. FIG. 14B illustrates an example measured TIL-TIA noise output integrated up to 50 MHz vs the lock range. The filtering effect of injection-locking may be measured with a standalone TIL-TIA, as illustrated in FIGS. 14A and 14B, with the first-order filtering effect clearly demonstrated. The phase noise shape of the measured free-running oscillator may be somewhat different from the analytical derivation due to supply noise and the absence of an amplitude-limiting mechanism in the measured circuit.

In some embodiments, there may be hase drift in an injection-locked amplifier. Being a first-order feedback loop, the TIL-TIA may track the input signal with a constant phase shift. Phase drift may be characterized as a slow long-term variation of this phase shift due to environmental changes that affect the integrated circuit. As mentioned, utilizing a TIL-TIA implies a small injection. In that case, the constant phase difference $\theta_0$ of an LC injection-locked oscillator can be expressed as a function of the free-running and injection frequencies $\omega_0$ and $\omega_{inj}$, respectively; of the output and injection strengths $I_0$ and $I_{inj}$, respectively; and of the tank quality factor Q, so that $$\sin(\theta_0) \approx \frac{2Q}{\epsilon} \cdot \frac{\omega_0 - \omega_{inj}}{\omega_0} \quad (17)$$

where $$\epsilon = \frac{I_{inj}}{I_0}$$

is the injection strength ratio. A similar effect may exist when utilizing tuned amplifiers in RF chains, but for a TIL-TIA, the situation may be exacerbated by a factor of 1/ϵ.

In some embodiments, this may set a lower limit on the injection strength depending on the oscillator sensitivity and the permissible long-term output timing drift. If a TIL-TIA drives a frequency multiplier (e.g. a PLL), its phase error $\theta_{tia,max}$ may be divided by the multiplication ratio N compared to the permissible PLL phase error $\theta_{out,max}$. Therefore, $\theta_{tia,max}$ can be expressed in terms of the allowable PLL output timing drift $t_{out,max}$, given the PLL output frequency of $f_{out}$, as $$\theta_{tia,max} = t_{out,max} \cdot \frac{2\pi f_{out}}{N} \quad (18)$$

Re-writing $\Delta = (\omega_0 - \omega_{inj})/\omega_0$ and substituting (18) into (17)

$$\epsilon > \frac{2Q\Delta_\omega}{\theta_{tia,max}} \quad (19)$$

where for small angles $\sin\theta_0 \approx \theta_0$. Conversely, $\Delta_\omega$ can be defined in terms of $\Delta_{\omega t}$, the rate of frequency drift and allowed phase drift period $t_{cor}$ as $$\Delta_\omega \approx \Delta_{\omega t} t_{cor} \quad (20)$$

In that case (19) can be re-arranged to set an upper limit for how frequently phase correction algorithms may be utilized to maintain acceptable long-term drift:

$$t_{cor} < \frac{\epsilon}{2Q\Delta_{\omega t}} \theta_{tia,max} \quad (21)$$

Figure 15B:
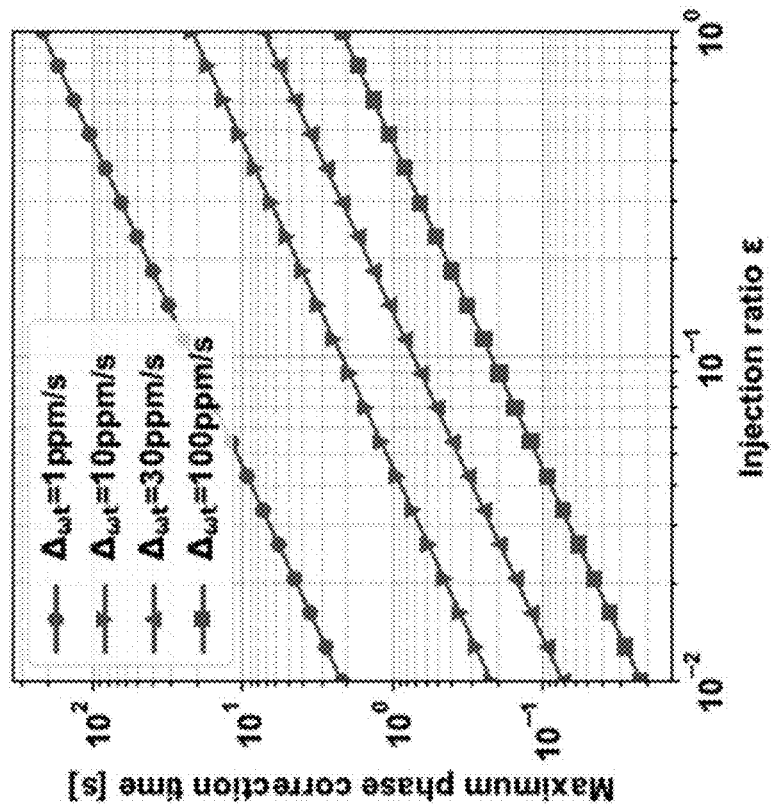
FIG. 15B illustrates example TIL-TIA noise output integrated up to 50 MHz vs the lock range.
Figure 15A:
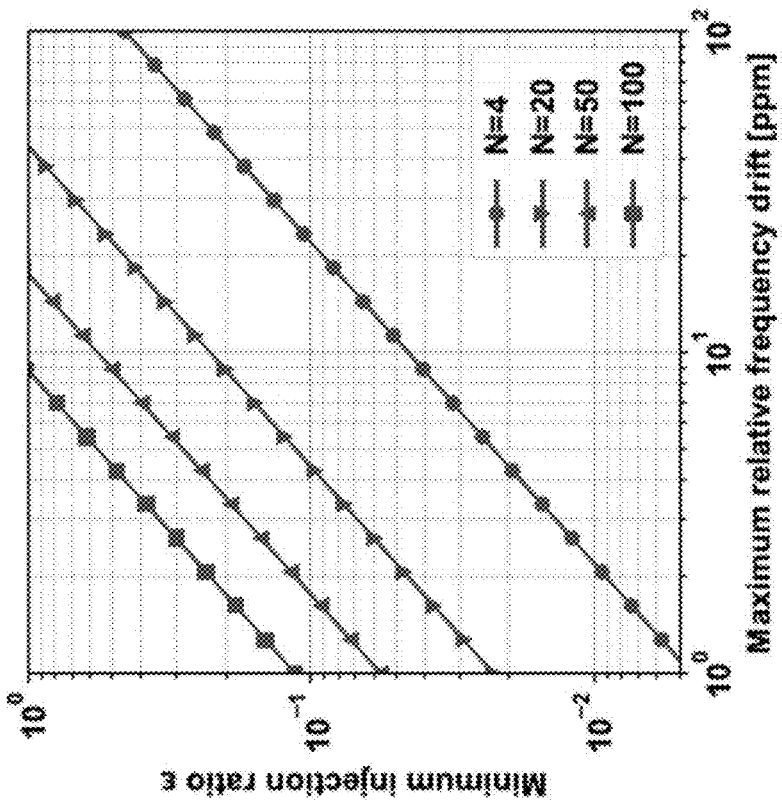
FIG. 15A illustrates example TIL-TIA noise output under variable injection strengths.

FIG. 15A illustrates example TIL-TIA noise output under variable injection strengths. FIG. 15A illustrates how (19) can be used to estimate the minimum injection ratio $\epsilon$ for a maximum output phase drift of 100 fs as a function of the normalized frequency drift for different division ratios, assuming a TIL-TIA with Q=10. Using a low-multiplier PLL subsequent to the TIL-TIA may significantly ease the design requirements. FIG. 15B illustrates example TIL-TIA noise output integrated up to 50 MHz vs the lock range. In FIG. 15B, (21) may be used to estimate the maximum allowed time interval before phase estimate algorithms may be utilized to correct for TIL-TIA frequency drift. In this case, frequency drifts may result mainly from temperature changes. The temperature may fluctuate on the order of 0.1° C./s. Temperature frequency drifts of uncompensated CMOS LC oscillators may be on the order of 100 ppm/° C., which translates to a frequency drift of 10 ppm/s. In some embodiments, the TIL-TIA may operate with normalized injection strengths of 0.05-0.1. In some embodiments, phase correction may occur once every few seconds. In some embodiments, drift compensation techniques can be used to further increase the phase correction intervals.

Examples of the Low Multiplier Frequency Synthesis

Figure 16:
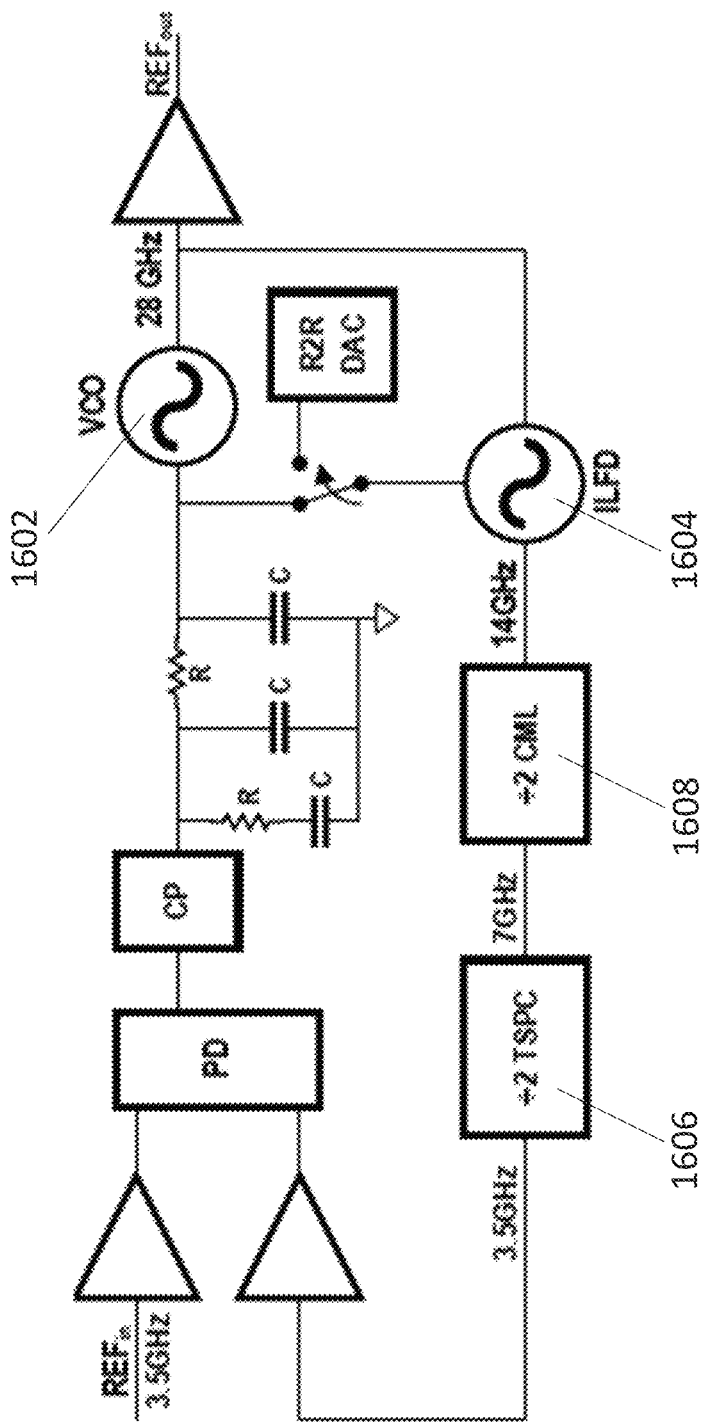
FIG. 16 illustrates a schematic of a PLL in accordance with an embodiment of the invention.

FIG. 16 illustrates a schematic of a PLL in accordance with an embodiment of the invention. The PLL includes a voltage controlled oscillator (VCO) 1602 and an injection locked frequency divider (ILFD) 1604. The PLL may multiply frequency from 3.5 GHz to 28 GHz. The PLL may be co-designed with the receiver amplifier to limit the output phase bandwidth to 50 MHz and reduce the reference related jitter, while keeping the VCO 1602 noise sufficiently low. The PLL may also include a true single phase clocked (TSPC) divider 1606 which is connected in series with a current mode logic (CML) divider 1608. The CML divider 1608 may be connected with the ILFD 1604

Figure 17:
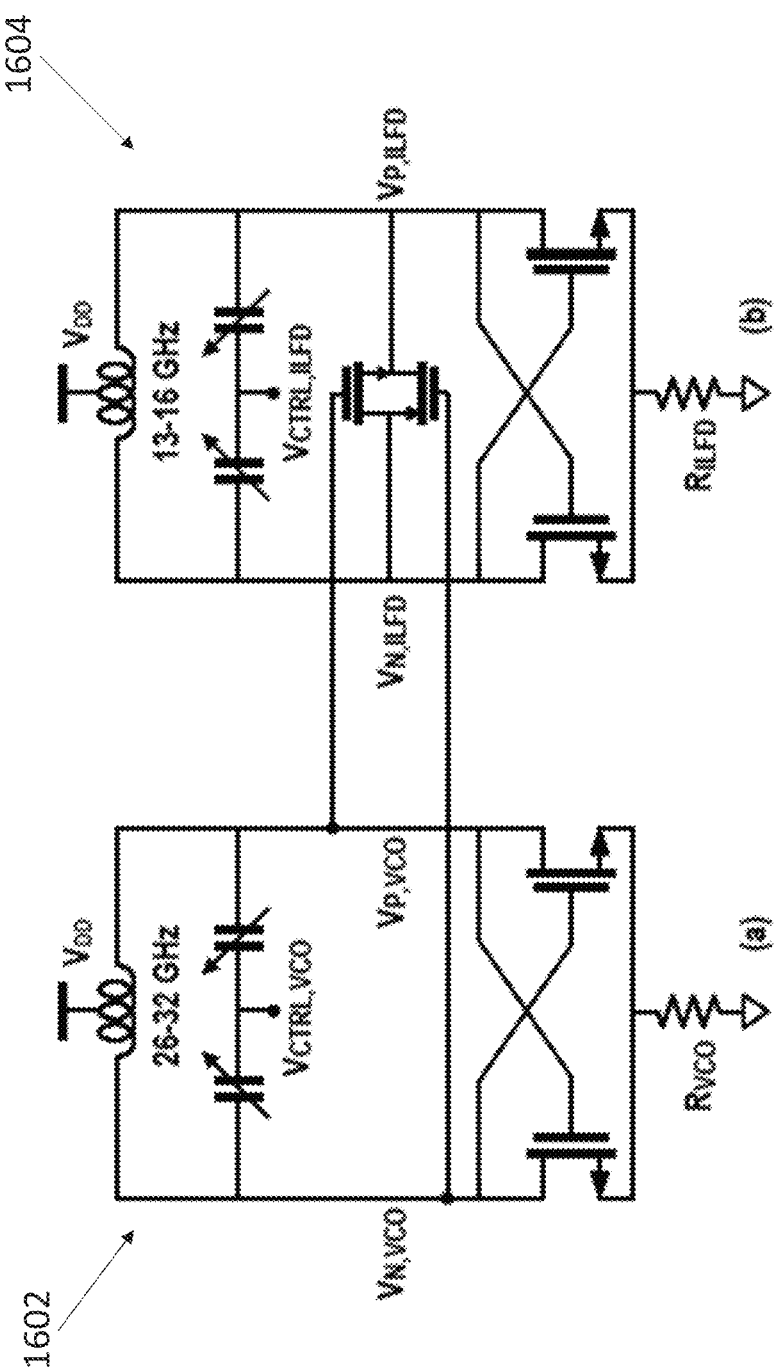
FIG. 17 illustrates a schematic of the VCO and the first stage ILFD of the PLL described in connection with FIG. 16 in accordance with an embodiment of the invention.
Figure 18B:
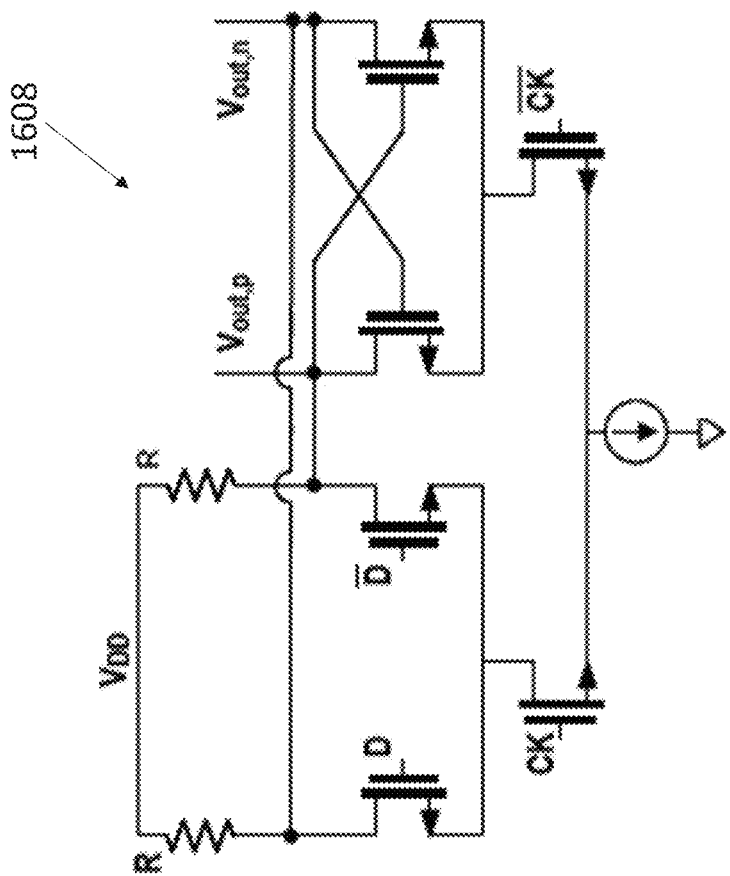
FIG. 18B illustrates a flip-flop building block schematic of the CML divider of the PLL described in connection with FIG. 16 in accordance with an embodiment of the invention.
Figure 18A:
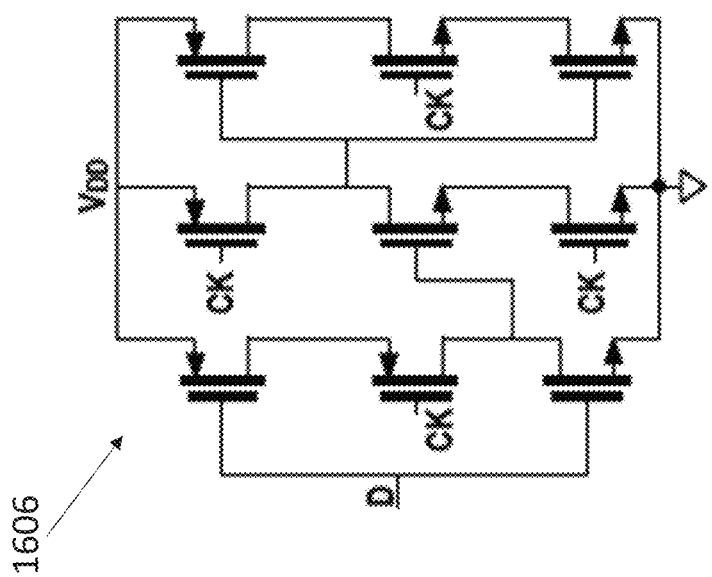
FIG. 18A illustrates a flip-flop building block schematic of the TSPC divider of the PLL described in connection with FIG. 16 in accordance with an embodiment of the invention.

FIG. 17 illustrates a schematic of the VCO 1602 and the first stage ILFD 1604 of the PLL described in connection with FIG. 16 in accordance with an embodiment of the invention. FIG. 18A illustrates a flip-flop building block schematic of the TSPC divider 1606 of the PLL described in connection with FIG. 16 in accordance with an embodiment of the invention. FIG. 18B illustrates a flip-flop building block schematic of the CML divider 1608 of the PLL described in connection with FIG. 16 in accordance with an embodiment of the invention. Due to the high output frequency, the ILFD 1604 may include a frequency range that is matched to the VCO 1602 control voltage dependence, followed by CML divider 1606 and TSPC divider 1608.

Figure 19B:
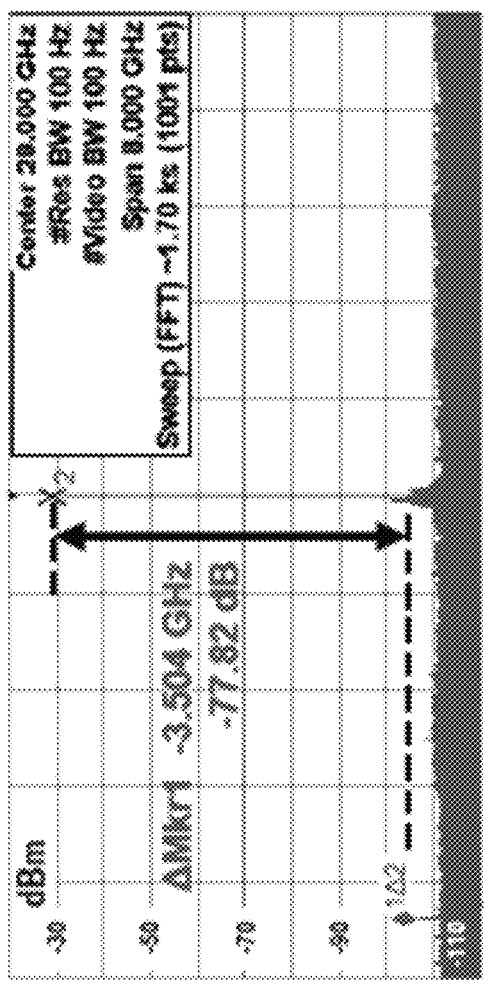
FIG. 19B illustrates an example of PLL measured integer spurs at 28 GHz.
Figure 19A:
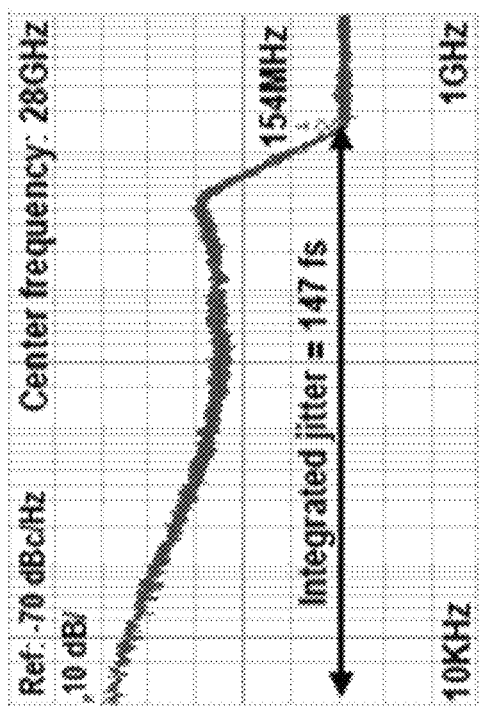
FIG. 19A illustrates an example of PLL measured phase noise.

FIG. 19A illustrates an example of PLL measured phase noise. FIG. 19B illustrates an example of PLL measured integer spurs at 28 GHz. In some embodiments, using a small multiplication ratio may achieve low jitter performance of 147 fs, as shown in FIG. 19A. In some embodiments, a low clock multiplier may reduce the risk of harmonic locking and the large spacing of reference spurs from the carrier may assist in suppressing them by the loop filter, the tuned RF path, and the antennas' bandwidths. The PLL may include reference spurs at a power of −77 dB below the carrier as illustrated in FIG. 19B. The asymmetric spur measurement might be due to amplitude noise in the measurement and/or asymmetric antenna bandwidth, which may also be included in the measurement. The improved spurious tone rejection may ease the system compliance with spectral disturbance levels.

Examples of the TX Channel

Figure 20:
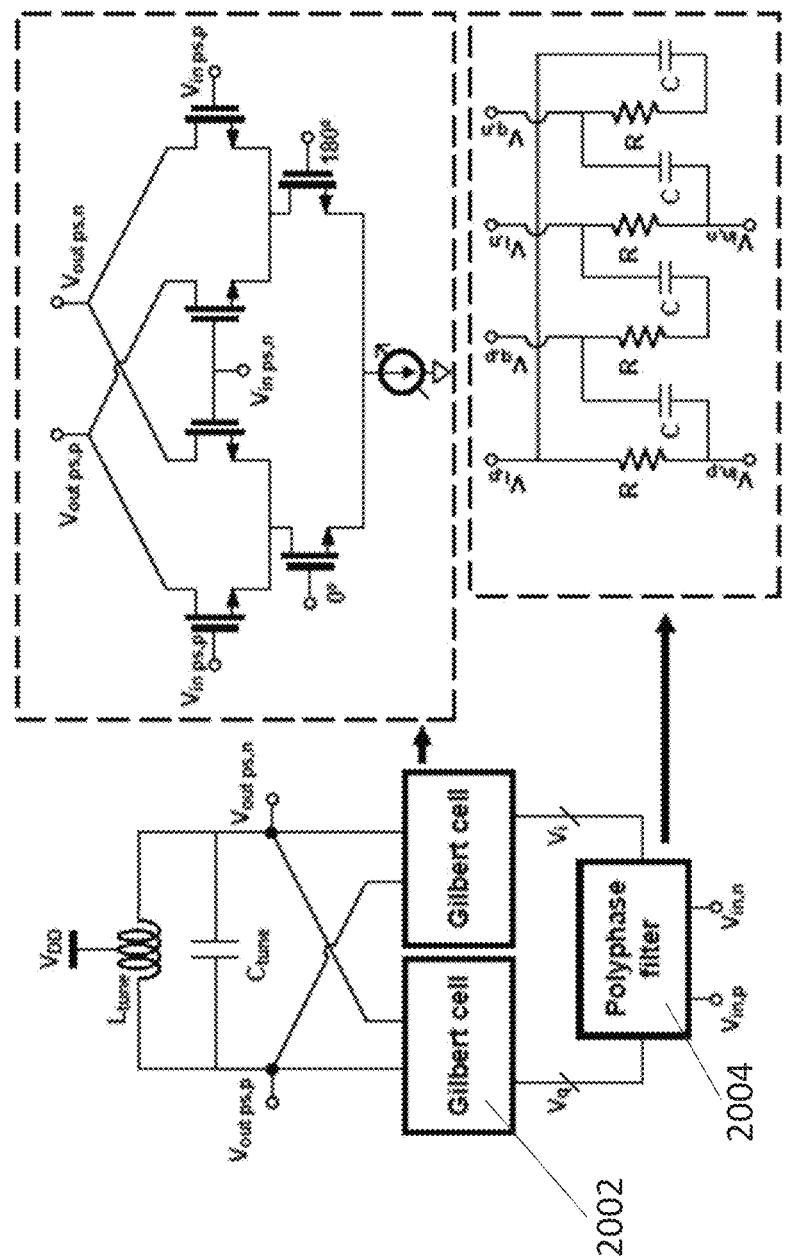
FIG. 20 illustrates a phase shifter schematic with Gilbert cell and polyphase filter in accordance with an embodiment of the invention.
Figure 21:
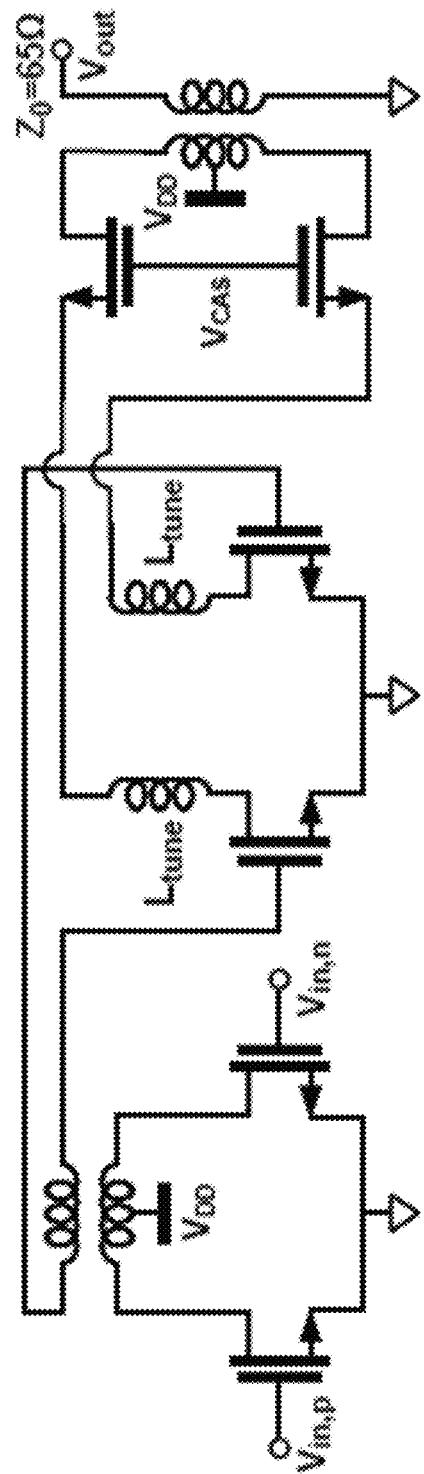
FIG. 21 illustrates a schematic of a power amplifier in accordance with an embodiment of the invention.

FIG. 20 illustrates a phase shifter schematic with Gilbert cell 2002 and polyphase filter 2004 in accordance with an embodiment of the invention. FIG. 21 illustrates a schematic of a power amplifier in accordance with an embodiment of the invention. The PLL output may be buffered by four independently programmable VGAs and routed to quadrants of pairs of TX channels. Each channel may be composed of the first-order RC polyphase filter 2004, a vector modulator, and the power amplifier (PA), as shown in FIGS. 20 and 21. The VGAs may directly drive two unbuffered polyphase filters 2004 to reduce the power consumption. Those are followed by independently controlled vector modulators which may double as buffer stages to minimize the coupling between the channels.

Figure 22:
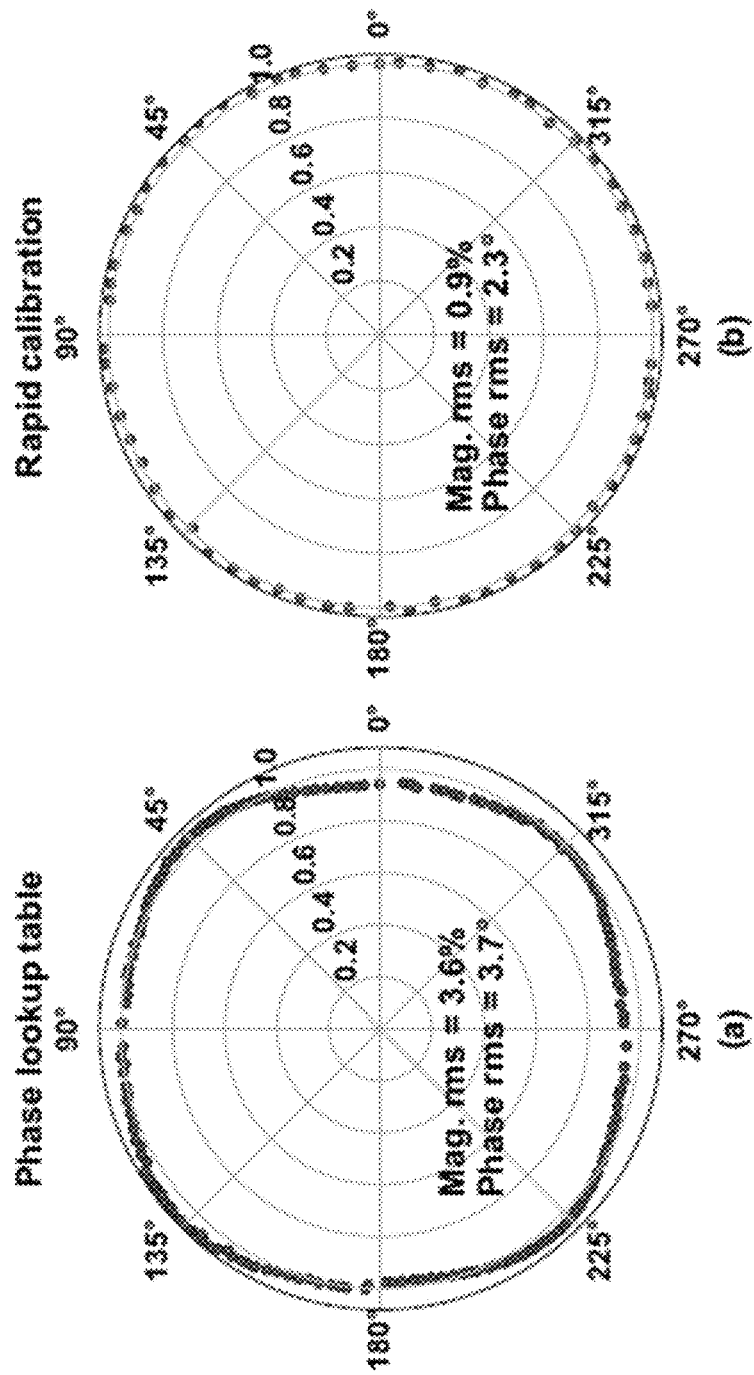
FIG. 22 illustrates an example phase shifter accuracy using an (a) initial lookup table and (b) a rapid search calibration algorithm.
Figure 23:
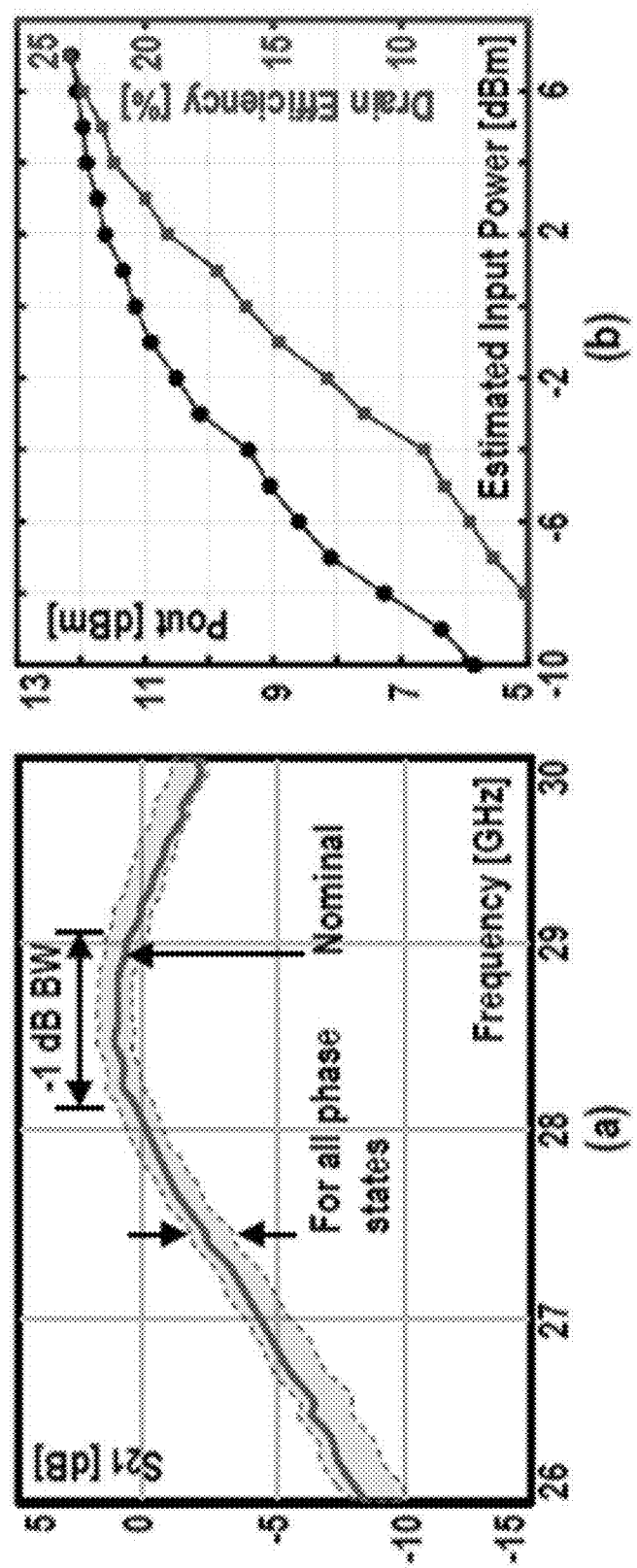
FIG. 23 illustrates an example power amplifier (a) small signal normalized gain and (b) output power and drain efficiency.

FIG. 22 illustrates an example phase shifter accuracy using an (a) initial lookup table and (b) a rapid search calibration algorithm. The vector modulators may be calibrated using a rapid search algorithm to a 6-bit resolution with phase and amplitude errors of 2.3° and 0.9% rms, respectively. FIG. 23 illustrates an example power amplifier (a) small signal normalized gain and (b) output power and drain efficiency. Each phase shifter may drive a two-stage power amplifier with an output −1 dB bandwidth of about 1 GHz, output power of more than +12 dBm at 28 GHz, and a drain efficiency of 23%. The total output power from the chip may be more than +21 dBm from a 1V power supply. The output power amplifier stage can work in a linear or switching mode, and may have series inductors added between the driving transistors and the cascode in order to align the output voltage and current waveforms, which slightly increases the drain efficiency.

Example System Architecture

Figure 24:
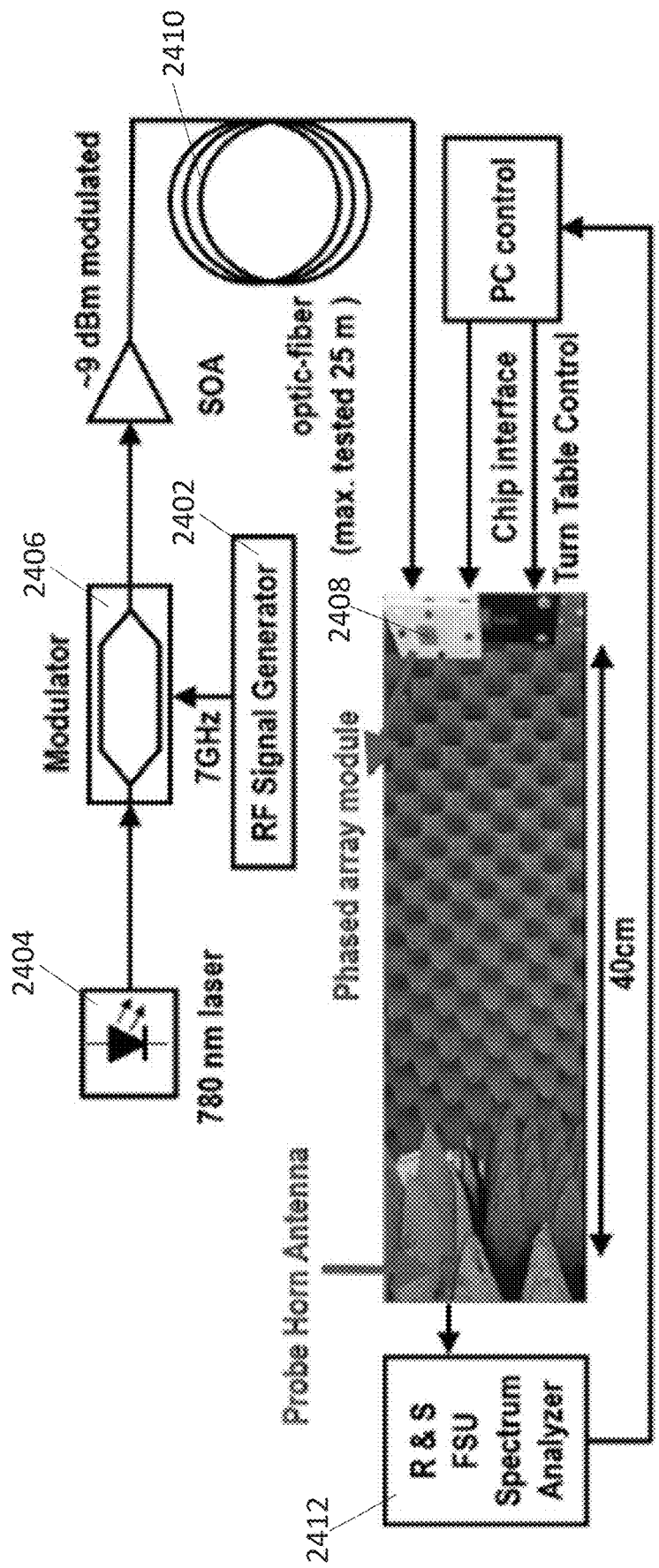
FIG. 24 illustrates an example system architecture for a single optically synchronized RFIC module in accordance with an embodiment of the invention.

FIG. 24 illustrates an example system architecture for a single optically synchronized RFIC module in accordance with an embodiment of the invention. The system architecture may be quantitatively evaluated, and its subblocks characterized. A single transmitter sub-module may be assembled in a small anechoic space. An RF signal generator 2402 may modulate a laser source 2404 through a modulator 2406 that distributes a clock reference to a phased array transmitter 2408 over a fiber 2410. The RF signal generator 2402 may output a 7 GHz signal. Other methods for generating the RF reference at the photodiode have been contemplated such as using a directly modulated laser, the beat-tone output of two lasers, an optoelectronic oscillator, or an optical frequency comb. These other methods, however, may impose noise, cost, and/or availability challenges with currently available off the shelf hardware. The narrow depletion region may dictate the use of a short wavelength, which may be constrained to 780 nm at the lowest by hardware availability for the output power requirements. A spectrum analyzer 2412 may include vector signal analysis capability and serve as a remote receiver. The remote receiver may be about 40 cm away from the RFIC to record its far field radiation pattern.

Single Module Optical Synchronization

Figure 25B:
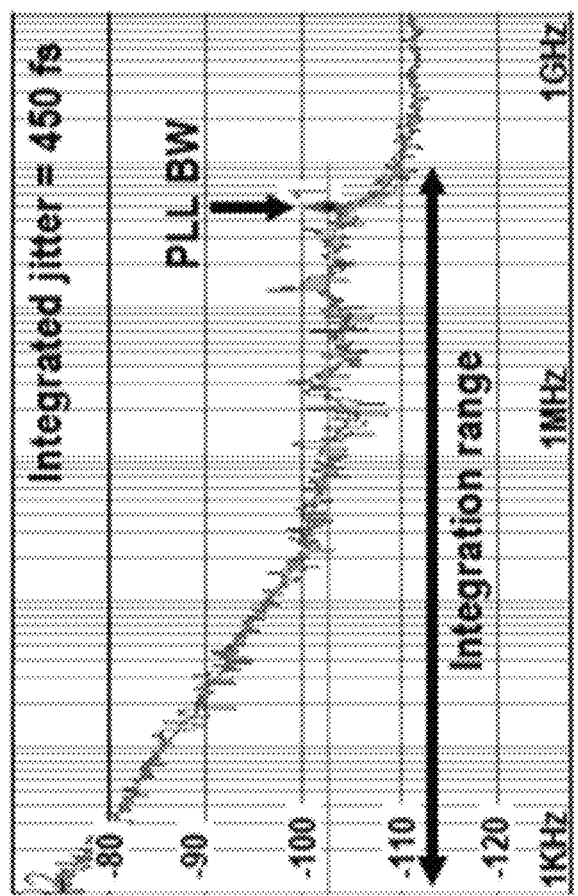
FIG. 25B illustrates an example system phase noise with an optical reference.
Figure 25A:
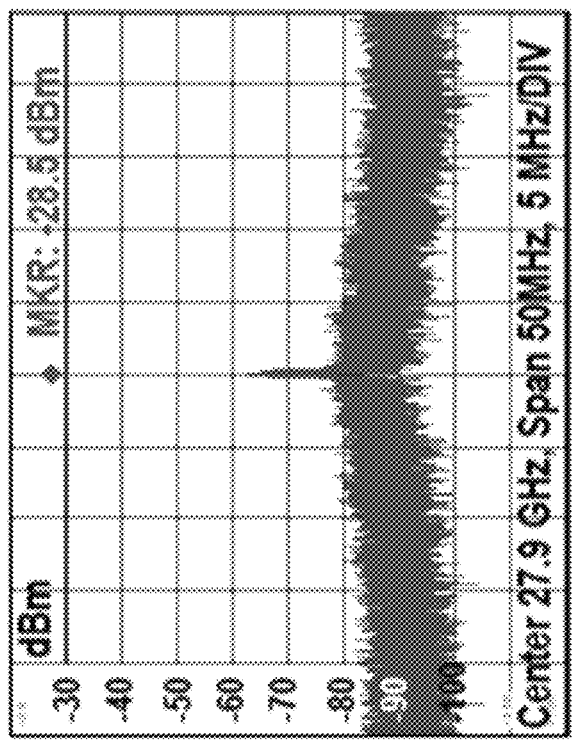
FIG. 25A illustrates an example output of an optically synchronized RFIC module.
Figure 26:
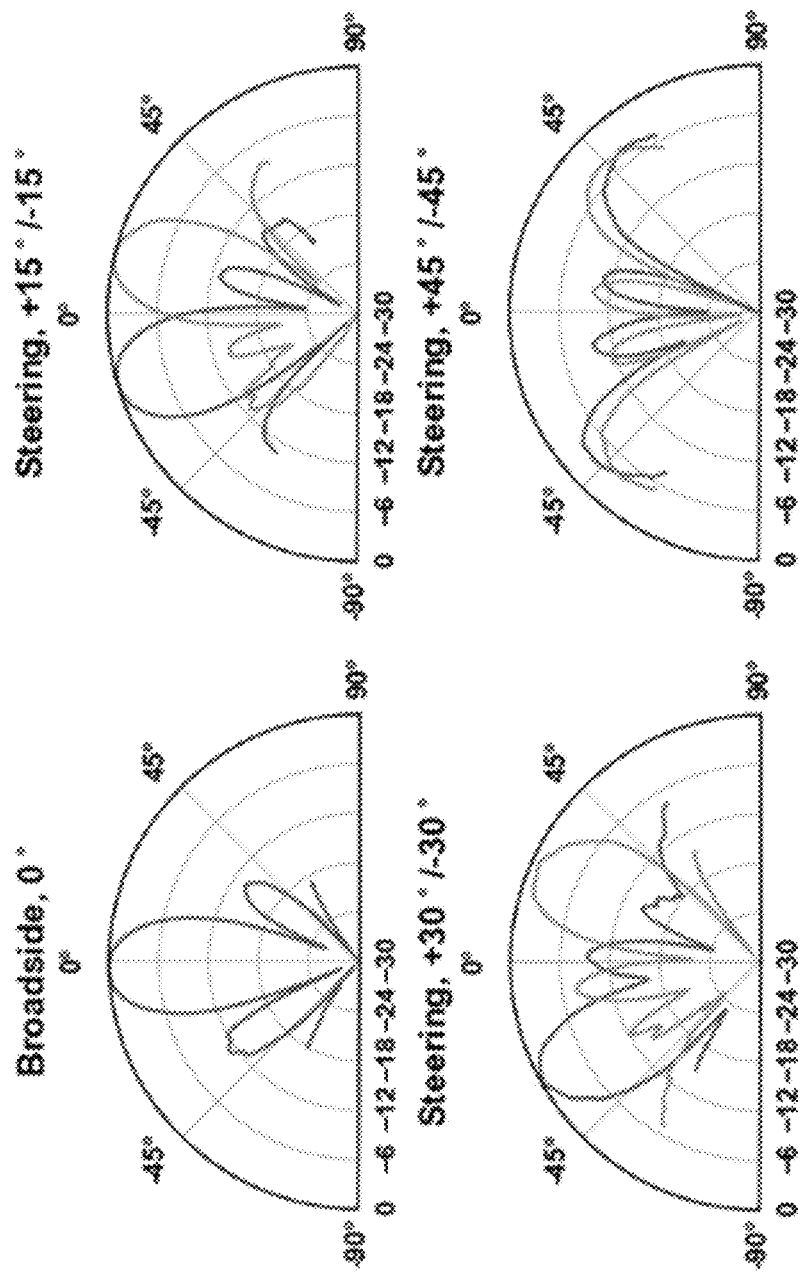
FIG. 26 illustrates various beam steering of an optically synchronized RFIC module.

FIG. 25A illustrates an example output of an optically synchronized RFIC module. The RFIC output signal spectrum may be at 28 GHz. FIG. 25B illustrates an example system phase noise with an optical reference. The measurements in FIGS. 25A and 25B may be performed with an integrated CMOS PD. The measured system timing jitter may be degraded as compared to the measurement of FIGS. 19A and 19B by various factors such as the limited performance of the laser source and by the limited extinction ratio of the optical modulator. The measured 28 GHz RF signal may also include additional amplitude noise due to the absence of an amplitude limiting mechanism at the spectrum analyzer input. FIG. 26 illustrates various beam steering of an optically synchronized RFIC module. In some embodiments, the CMOS PD may be mounted next to the RFIC. In some embodiments, the PD may be integrated as illustrated in FIGS. 8A-8C. In some embodiments, the beam steering capabilities of the optically synchronized array may have symmetrical radiation patterns from 0° to ±45°.

Data Transmission

Figures 27A, 27B:
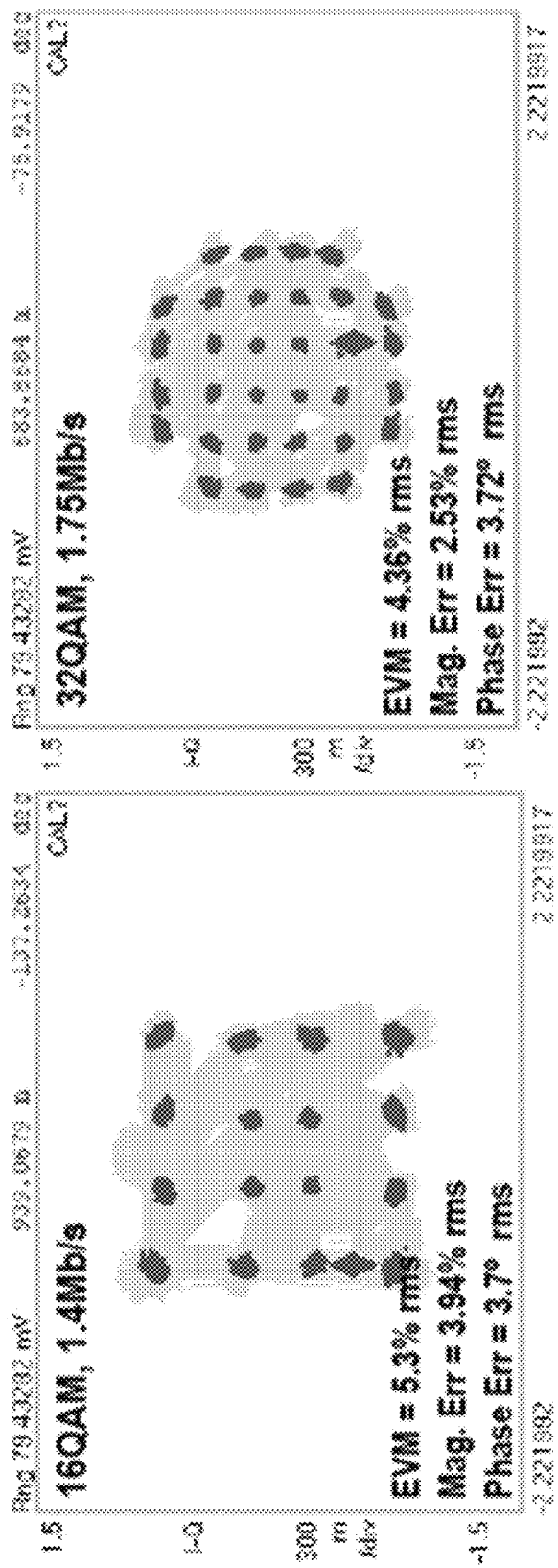
FIG. 27A illustrates an OTS wireless transmission of a 16-QAM modulated signal.
FIG. 27B illustrates an OTS wireless transmission of a 32-QAM modulated signal.

FIG. 27A illustrates an example OTS wireless transmission of a 16-QAM modulated signal. FIG. 27B illustrates an example OTS wireless transmission of a 32-QAM modulated signal. Transmission of 16-QAM and 32-QAM modulated data streams through the array may be achieved through programming the IQ phase-shifter steering angles. Some embodiments may include a single output channel in order to minimize multipath reflections, using a pseudo-random custom logic state machine implemented on an FPGA. The data rate may be limited by the serial interface programming speed, but the output bandwidth of the chip is greater than 1 GHz and may support much higher data rates. FIGS. 27A and 27B illustrate the raw measurement of the received signal, measured by a signal analyzer. The error vector magnitude (EVM) may include the effect of a deterministically imperfect constellation generated using the vector modulator.

Synchronizing Two Remote Phased Arrays

Figure 28:
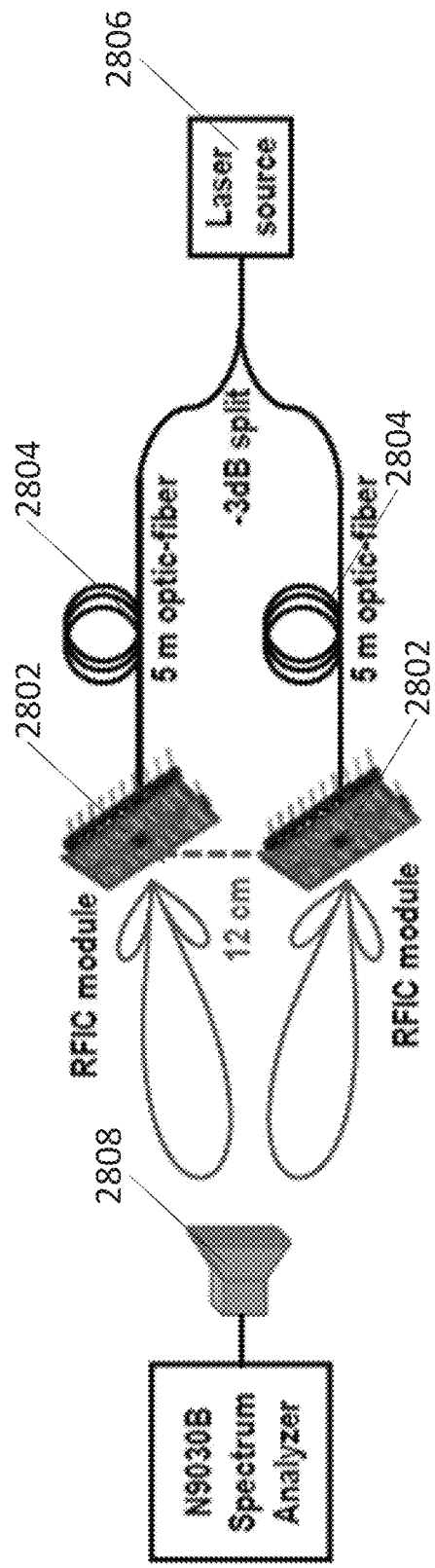
FIG. 28 illustrates an example optical synchronization of two RFIC modules in accordance with an embodiment of the invention.

FIG. 28 illustrates an example optical synchronization of two RFIC modules in accordance with an embodiment of the invention. OTS was used to synchronize two electrically distant array modules 2802. The two phased array modules 2802 were synchronized through two optical fibers 2804 carrying the same optical signals from a laser source 2806, as shown in FIG. 28. A single antenna on each module 2802 was activated, which results in different received powers from each chip since the modules 2802 were not identically aligned with the receiver 2808. Activating only one element may allow reliably sweeping the phase setting of one module 2802 with respect to the other.

Figure 29B:
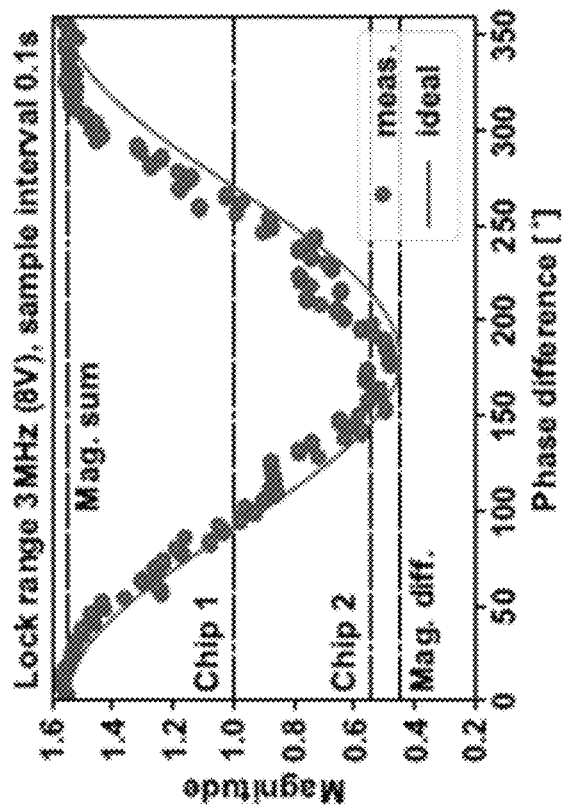
FIGS. 29A-29D illustrates various two chip phase coherence measurements.
Figure 29A:
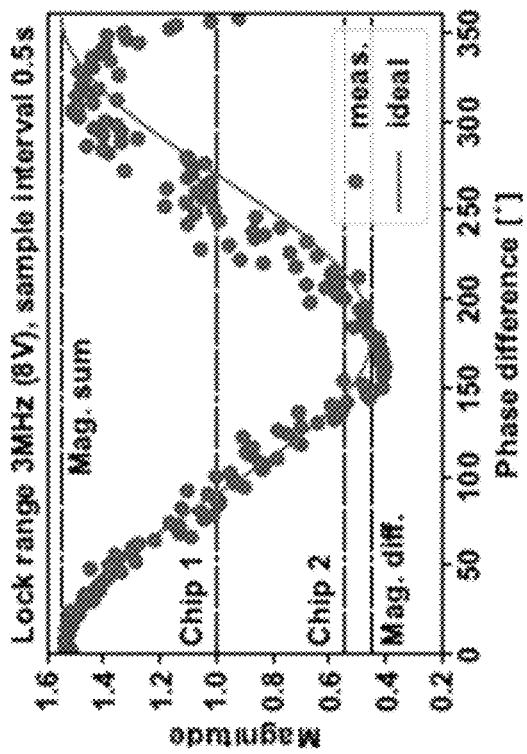
Figure 29D:
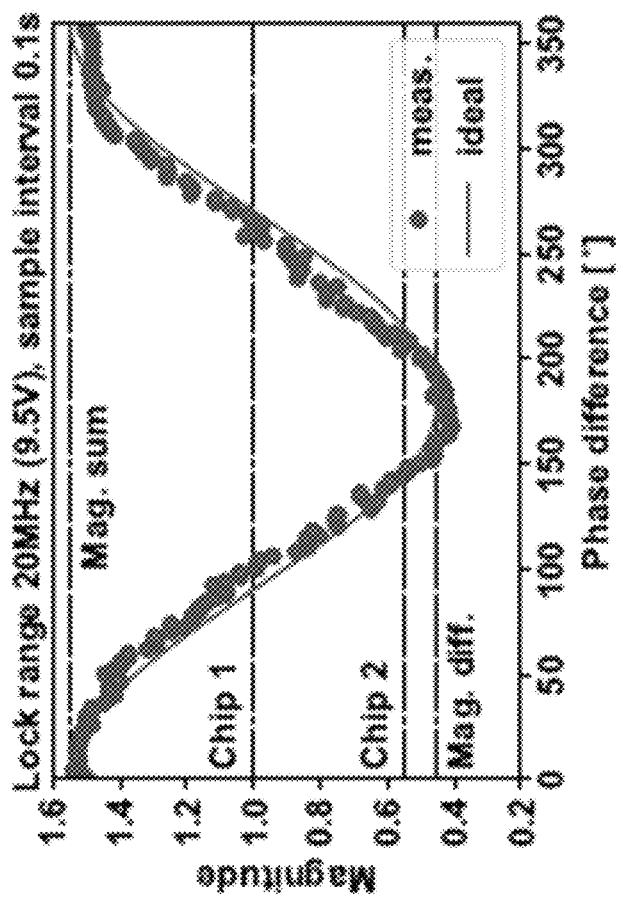
Figure 29C:
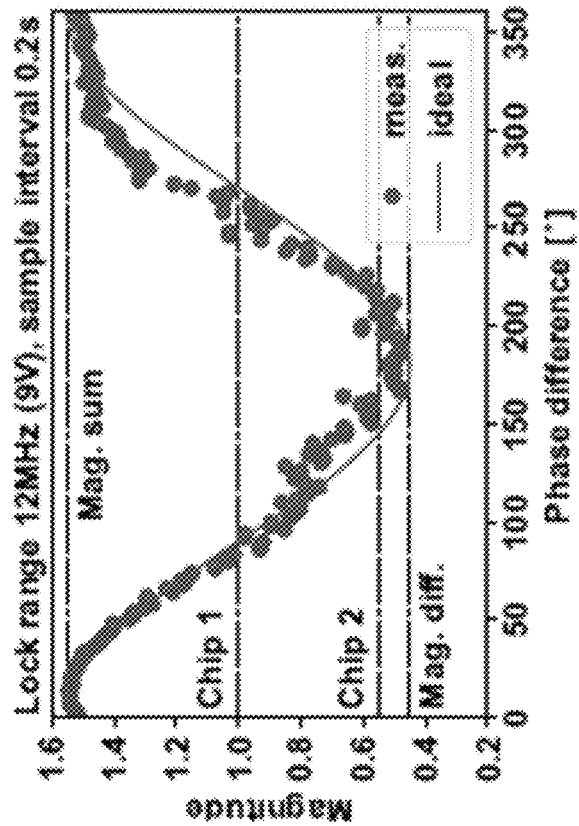

FIGS. 29A-29D illustrates various two chip phase coherence measurements. The lock range may be changed by controlling the PD reverse bias voltage. FIGS. 29A-29D show that the modules are indeed synchronized, that their received signals can be coherently added or subtracted, and that the quality of the phase coherence in terms of drift-over-time depends on the injection strength (lock range) as predicted by (21). For a very narrow lock range at slow sample intervals (FIG. 29A) the coherent addition suffers from significant phase drift until eventually one of the sources loses lock. As the injection strength increases and measurement time shortens, the signal addition follows the expected sinusoidal pattern very closely (FIG. 29D). In a second measurement, half the array elements in each module are turned on and steered towards the receiver so the received signals have similar magnitudes.

Figure 30B:
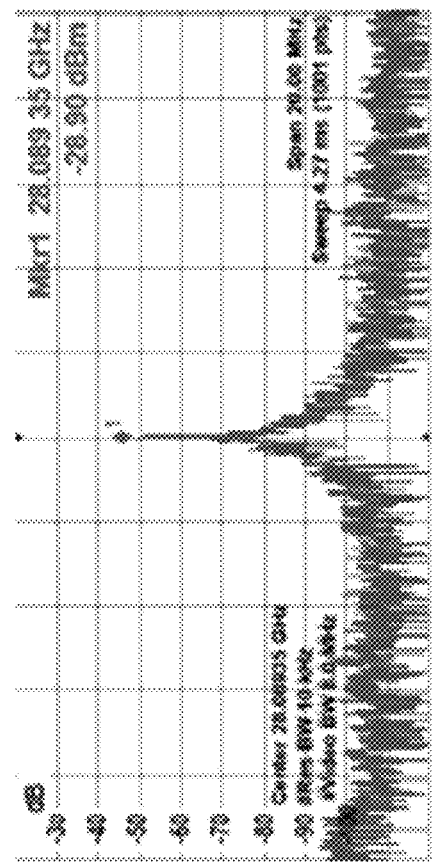
FIGS. 30A-30D illustrates optical synchronization of the two modules described in connection with FIG. 28.
Figure 30A:
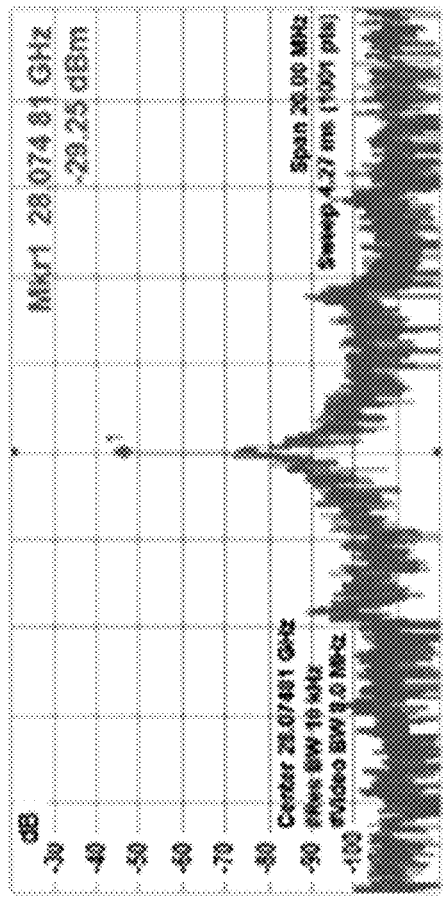
Figure 30D:
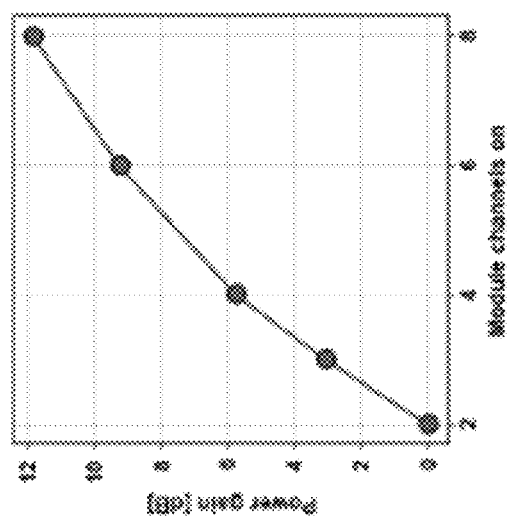
Figure 30C:
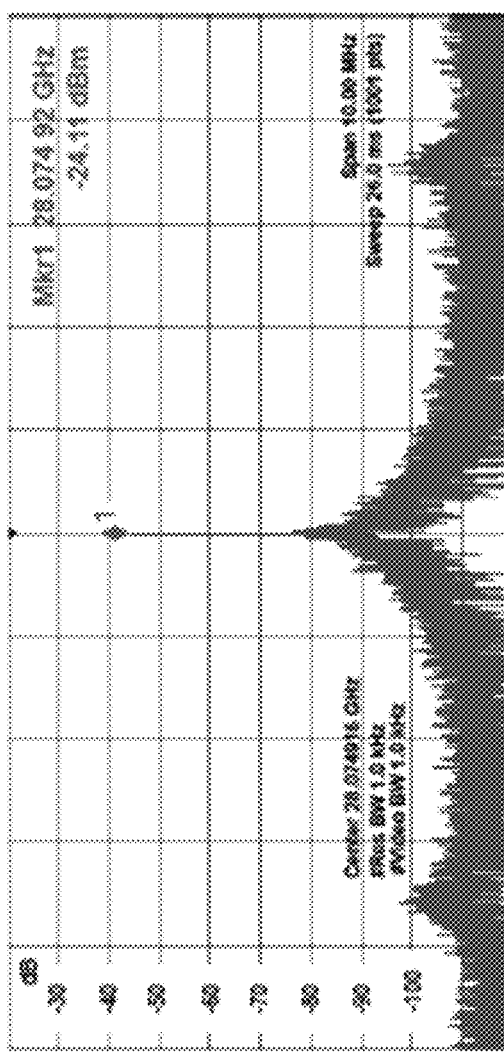

FIGS. 30A-30D illustrates optical synchronization of the two modules 2802 described in connection with FIG. 28. FIG. 30A illustrates a first module 2802 peak power at −29.25 dBm. FIG. 30B illustrates a second module 2802 peak power at −28.90 dBm. FIG. 30C illustrates combined peak power at −24.11 dBm demonstrating coherent addition of the two module 2802 outputs. FIG. 30D illustrates the normalized power vs. the number of active elements radiated by a single RFIC module 2802. Once both of the chips are operated concurrently, a coherent increase of received power, comparable to the total power received by a single module with all its array elements steered broadside.

Some embodiments include the design and measurement of a fully integrated OTS system in a bulk CMOS process. Quantitative analysis of the benefits of an OTS system and estimating were performed. In some embodiments, an optically synchronized 28 GHz phased array transmitter with beam steering, remote module synchronization, and data transmission capabilities may be provided. The implementation of OTS in low cost CMOS may enable the scaling of arrays in high-volume, lightweight, low-cost, and large-span commercial applications. OTS may reduce the mass, cost, and loss of the synchronization infrastructure. OTS may provide an alternative to traditional high-frequency clocking schemes.

DOCTRINE OF EQUIVALENTS

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A phased antenna array comprising:
   an optical timing source; and
   a plurality of sub-arrays configured to transmit a signal, wherein each sub-array comprises:
      an integrated circuit;
      at least one antenna element controlled by the integrated circuit;
      a photo diode configured to receive a shared optical timing signal from the optical timing source and generate a timing information signal, wherein the photo diode comprises: an N-well; a P-well electrically connected with the N-well to form a PN junction; an N-well contact in electrical connection with the N-well; and a P-well contact in electrical connection with the P-well, wherein the N-well contact and P-well contact are separated through a shallow trench isolation;
      an amplifier configured to receive the timing information signal from the photo diode; and
      a phase-locked loop connected to the amplifier and configured to generate an electronic synchronization signal which is distributed to one or more channels.

2. The phased antenna array of claim 1, wherein each channel is connected to an antenna configured to broadcast the signal.

3. The phased antenna array of claim 2, wherein the antennas are located on a modular printed circuit board and the integrated circuit is a flip chip bonded to the modular printed circuit board.

4. The phased antenna array of claim 1, wherein the integrated circuit comprises the photo diode.

5. The phased antenna array of claim 1, wherein the integrated circuit comprises the amplifier.

6. The phased antenna array of claim 1, wherein the integrated circuit comprises the phase-locked loop.

7. The phased antenna array of claim 1, wherein the integrated circuit comprises the photo diode, the amplifier, and the phase-locked loop.

8. The phased antenna array of claim 1, wherein the shared optical timing signal is distributed to each photo diode using optical fibers or through free space using a laser beam.

9. The phased antenna array of claim 8, wherein the optical fibers are held in place by an optical fiber holder which holds the output of the optical fibers in optical connection with the photo diode.

10. The phase antenna array of claim 9, wherein the optical fibers are optically connected with the photo diode through a via hole in the modular printed circuit board.

11. The phased antenna array of claim 10, wherein the optical fiber holder is held in place by a bottom board which is rigidly connected to headers.

12. The phased antenna array of claim 11, wherein the headers support the modular printed circuit board.

13. The phased antenna array of claim 12, wherein the headers and bottom board distribute power and communication signals to the modules.

14. The phased antenna array of claim 1, wherein the one or more channels perform beamforming and/or data transfer.

15. The phased antenna array of claim 1, wherein the one or more channels have independently controlled phase amplitudes.

16. The phased antenna array of claim 1, wherein adjacent modules are spaced apart to create a sparse array.

17. A phased antenna array comprising:
an optical timing source; and
a plurality of sub-arrays configured to transmit a signal, wherein each sub-array comprises:
 an integrated circuit;
 at least one antenna element controlled by the integrated circuit;
 a photo diode configured to receive a shared optical timing signal from the optical timing source and generate a timing information signal;
 an amplifier configured to receive the timing information signal from the photo diode;
 a phase-locked loop connected to the amplifier and configured to generate an electronic synchronization signal which is distributed to one or more channels; and
 a resonant circuit connected in parallel with the photo diode.

18. The phased antenna array of claim 17, wherein the resonant circuit comprises an inductor and a capacitor which establishes resonant behavior in which energy oscillates between storage in the inductor and storage in the capacitor.

19. The phased antenna array of claim 17, wherein the capacitor, inductor, and photo diode are all directly connected to the amplifier.

20. The phased antenna array of claim 17, wherein the resonant circuit produces an injection locked amplifier.

21. The phased antenna array of claim 17, wherein the capacitor and the inductor are located on the integrated circuit.

22. An optically synchronized integrated circuit comprising:
a photo diode configured to receive a shared optical timing signal and generate a timing information signal;
an amplifier configured to receive the timing information signal from the photo diode;
a phase-locked loop connected to the amplifier and configured to generate an electronic synchronization signal which is distributed to one or more channels; and
a resonant circuit connected in parallel with the photo diode.

23. The optically synchronized integrated circuit of claim 22, wherein each channel is connected to an antenna configured to broadcast the signal.

24. The optically synchronized integrated circuit of claim 22, wherein the resonant circuit comprises an inductor and a capacitor which establishes resonant behavior in which energy oscillates between storage in the inductor and storage in the capacitor.

25. The optically synchronized integrated circuit of claim 24, wherein the capacitor, inductor, and photo diode are all directly connected to the amplifier.

26. The optically synchronized integrated circuit of claim 22, wherein the photo diode comprises:
an N-well;
a P-well electrically connected with the N-well to form a PN junction;
an N-well contact in electrical connection with the N-well; and
a P-well contact in electrical connection with the P-well, wherein the N-well contact and P-well contact are separated through a shallow trench isolation.

* * * * *